United States Patent
Yaginuma

(10) Patent No.: US 9,559,787 B2
(45) Date of Patent: Jan. 31, 2017

(54) PHOTOCOUPLING DEVICE MANUFACTURING METHOD, PHOTOCOUPLING DEVICE, AND POWER CONVERSION SYSTEM

(71) Applicant: Renesas Electronics Corporation, Tokyo (JP)

(72) Inventor: Ryuta Yaginuma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/812,492

(22) Filed: Jul. 29, 2015

(65) Prior Publication Data
US 2016/0043811 A1  Feb. 11, 2016

(30) Foreign Application Priority Data

Aug. 7, 2014 (JP) .................................. 2014-161946

(51) Int. Cl.
| | |
|---|---|
| H04B 10/80 | (2013.01) |
| H01L 25/16 | (2006.01) |
| H01L 25/00 | (2006.01) |
| H01L 31/14 | (2006.01) |
| H01L 23/00 | (2006.01) |

(52) U.S. Cl.
CPC ............ *H04B 10/802* (2013.01); *H01L 24/97* (2013.01); *H01L 25/167* (2013.01); *H01L 25/50* (2013.01); *H01L 31/14* (2013.01); *H01L 2224/05554* (2013.01); *H01L 2224/48091* (2013.01); *H01L 2224/48247* (2013.01); *H01L 2224/49171* (2013.01); *H01L 2924/13055* (2013.01); *H01L 2924/181* (2013.01)

(58) Field of Classification Search
CPC ....... H01L 24/97; H01L 25/167; H04B 10/802
See application file for complete search history.

(56) References Cited

U.S. PATENT DOCUMENTS

| | | | | |
|---|---|---|---|---|
| 2008/0230727 | A1* | 9/2008 | Horino | H01L 31/167 250/551 |
| 2013/0109115 | A1* | 5/2013 | Nagafuchi | B25B 11/02 438/25 |
| 2013/0221248 | A1* | 8/2013 | Komoto | G01J 1/42 250/551 |

FOREIGN PATENT DOCUMENTS

JP   2013-175561 A   9/2013

* cited by examiner

*Primary Examiner* — Daniel Shook
(74) *Attorney, Agent, or Firm* — Sughrue Mion, PLLC

(57) ABSTRACT

The alignment accuracy between light emitting elements, light receiving elements, and an insulating film is improved. A photocoupling device manufacturing method includes preparing a first lead frame having a first frame part supporting light receiving elements and a second lead frame having a second frame part supporting light emitting elements. The method also includes superposing the first and the second lead frame such that the light receiving elements and the light emitting elements mutually oppose via a first light-transmissive resin covering the light receiving elements, a second light-transmissive resin covering the light emitting elements, and an insulating film sheet positioned between the first and the second light-transmissive resin. The insulating film sheet includes body parts positioned between the light receiving elements and the light emitting elements, joining parts joined to the body parts, and a third frame part fixed between the first and the second frame part.

7 Claims, 23 Drawing Sheets

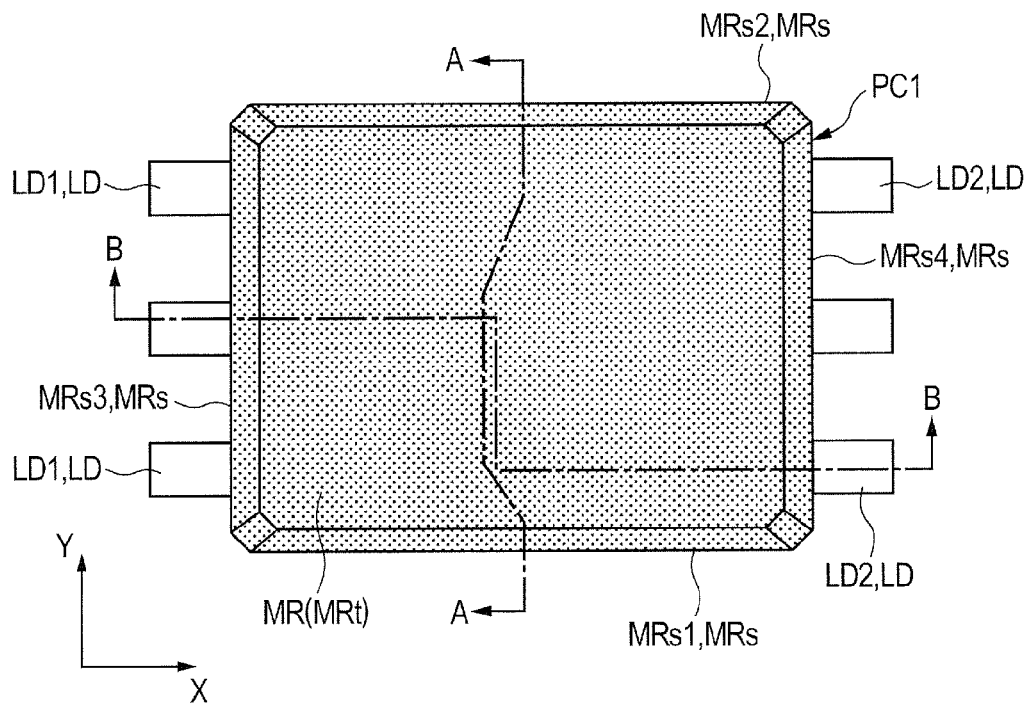
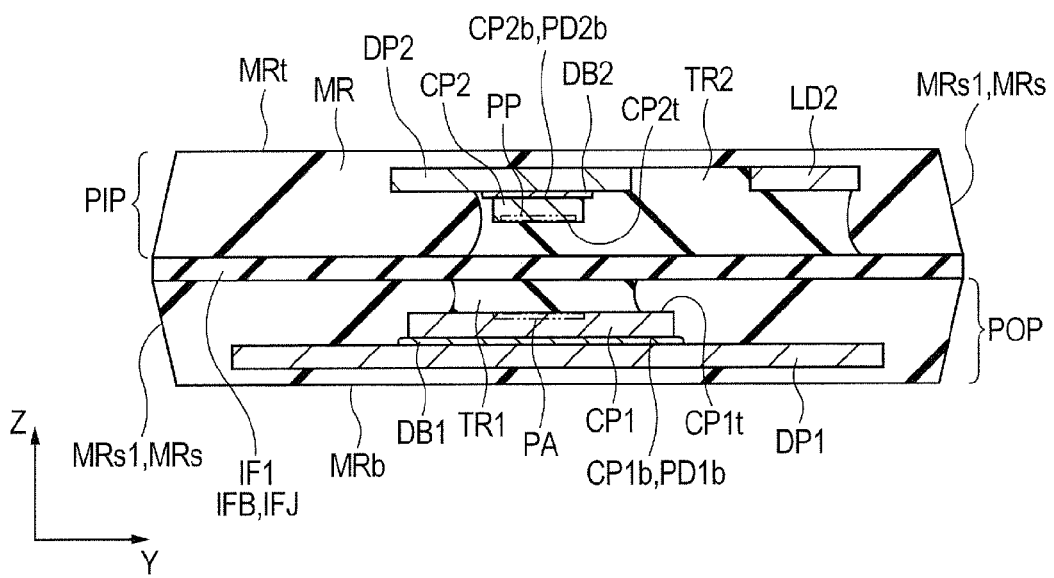

PHOTOCOUPLING DEVICE MANUFACTURING METHOD, PHOTOCOUPLING DEVICE, AND POWER CONVERSION SYSTEM

CROSS-REFERENCE TO RELATED APPLICATIONS

The disclosure of Japanese Patent Application No. 2014-161946 filed on Aug. 7, 2014 including the specification, drawings and abstract is incorporated herein by reference in its entirety.

BACKGROUND

The present invention relates to a photocoupling device and a manufacturing technique therefor or relates to a power conversion system using a photocoupling device.

In Japanese Unexamined Patent Application Publication No. 2013-175561, a photocoupler is described which has been sealed with resin in a state with a light emitting element and a light receiving element positioned to oppose each other via a light-transmissive insulating film.

SUMMARY

A photocoupling device is a device for transmitting optical signals between alight emitting element and alight receiving element. Optical signal transmission technology enables a signal transmission path to be electrically isolated. An advantage of this is that arranging a photocoupling device between a primary electrical circuit and a secondary electrical circuit electrically isolates the two circuits from each other. There is also a technique in which, from the viewpoint of enhancing the electrical insulation between a light emitting element and a light receiving element, an electrically insulating film material (hereinafter referred to as an "insulating film") is positioned between the light emitting element and the light receiving element.

In fabricating a photocoupling device, however, it is difficult to accurately align a light emitting element, a light receiving element, and an insulating film with high accuracy and to fix them in the accurately aligned state.

Other objects and novel features of the present invention will become apparent from the description of the present specification and the attached drawings.

The photocoupling device manufacturing method according to an embodiment of the present invention includes a step of preparing a first lead frame having a first frame part to support first optical elements and a second lead frame having a second frame part to support second optical elements. The photocoupling device manufacturing method also includes a step of superposing the first lead frame and the second lead frame such that the first optical elements and the second optical elements respectively oppose each other via a first light-transmissive resin covering the first optical elements, a second light-transmissive resin covering the second optical elements, and a light-transmissive insulating film sheet positioned between the first light-transmissive resin and the second light-transmissive resin. The insulating film sheet includes body parts positioned between the first optical elements and the second optical elements, respectively, plural joining parts joined to the body parts, and a third frame part fixed between the first frame part and the second frame part.

According to the above embodiment, the accuracy of positional alignment between a light emitting element, a light receiving element, and an insulating film can be improved.

BRIEF DESCRIPTION OF THE DRAWINGS

FIG. 2 is a plan view showing an external structure of an example of the photocoupler shown in FIG. 1.

FIG. 3 is a sectional view taken along line A-A in FIG. 2.

DETAILED DESCRIPTION

Figure 1:
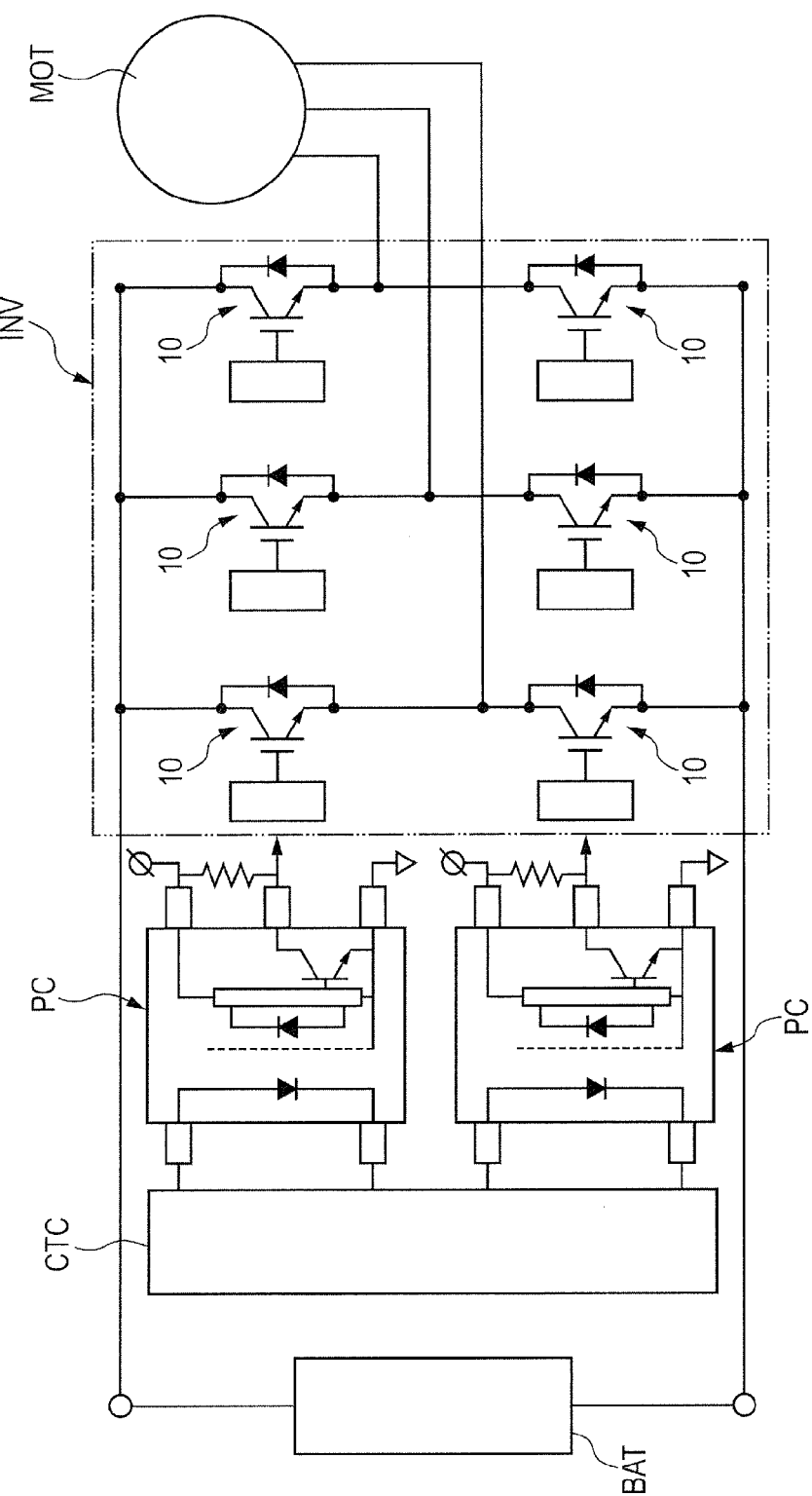
FIG. 1 is an explanatory drawing (circuit block diagram) of an example of a power conversion system (power conversion device) using a photocoupling device according to an embodiment of the present invention.

In the following, the description will be divided into two or more sections or will range over two or more embodiments as required for the sake of convenience. Unless otherwise expressed, such sections and embodiments are not mutually irrelevant. For example, among such sections and embodiments, one is a partial or total modification of another, or one elaborates or supplements another. Also, numbers referred to in the following description of embodiments (for example, numbers representing counts, amounts, ranges, or other numeric values) do not represent defined values, that is, they may be smaller or larger unless otherwise expressed or except when they are apparently defined in principle.

Furthermore, the constituent elements (including element steps) of the following embodiments are not necessarily indispensable unless otherwise expressed or except when they are considered apparently indispensable in principle. Similarly, the shapes of and positional relationships between constituent elements referred to in the following description are inclusive of those substantially close to or similar to them unless otherwise expressed or except when such shapes and positional relationships are apparently considered strictly defined in principle. This also applies to the numeric values and ranges.

In the following, embodiments of the present invention will be described in detail. Note that, in all drawings referred to in describing the following embodiments, parts and members having identical functions are denoted by identical reference numerals and symbols and that, as a rule, descriptions of such identical or similar parts and members are not repeated except when particularly necessary.

Note that the drawings referred to in describing the following embodiments may include sectional views non-hatched to make them clearer or plan views hatched to make them clearer.

<Power Conversion System Using Photocoupler>

An example of a power conversion system using a photocoupler according to an embodiment of the present invention will be described below. FIG. 1 is a circuit block diagram of a power conversion system (power conversion device) using a photocoupler of the present embodiment.

The power conversion system shown in FIG. 1 includes a load such as a motor MOT, an inverter (an amplifier circuit part) INV, a power supply BAT, a control part (a control circuit) CTC, and photocouplers (photocoupling devices, photocoupling parts) PCs. In the present example, the motor MOT is a three-phase motor driven by voltages of three different phases. The photocouplers PCs are each a photocoupling part positioned between an electrical circuit making up the inverter INV and an electrical circuit making up the control part CTC. The photocouplers PCs electrically insulate the inverter INV and the control part CTC from each other and have a function to transmit signals from the control part CTC to the inverter INV.

In the power conversion system shown in FIG. 1, the power supply BAT is coupled to the inverter INV, allowing the voltage (power) of the battery BAT to be supplied to the inverter INV. A converter or a relay, neither shown, may be positioned between the power supply BAT and the inverter INV so as to convert the voltage supplied to the inverter INV or so as to switch the state of coupling between the power supply BAT and the inverter INV.

The inverter INV is coupled with the motor MOT, and the DC voltage (DC power) supplied from the power supply BAT to the inverter INV is supplied to the motor MOT after being converted into an AC voltage (AC power) at the inverter INV. Thus, the MOT is driven by the AC voltage (AC power) supplied from the inverter INV.

The inverter INV is also coupled with the control part CTC that controls the inverter INV. Namely, the power supply BAT supplies a DC voltage (DC power) to the inverter INV, the DC voltage (DC power) is converted into an AC voltage (AC power) by the inverter INV controlled by the control part CTS, and the AC voltage (AC power) is supplied to the motor MOT to drive the motor MOT. The control part CTC is configured with, for example, an electronic control unit (ECU) which includes a control semiconductor chip such as a micro-controller unit (MCU).

The inverter INV includes six insulated gate bipolar transistors (IGBTs) 10s corresponding to the three phases of AC power. Namely, in each of the three phases, an IGBT 10 is coupled between the supply potential (VCC) supplied from the power supply BAT to the inverter INV and the input potential to the motor MOT, and another IGBT 10 is coupled between the input potential to the motor MOT and the ground potential (GND).

The motor MOT is driven (rotated) with the currents flowing through the IGBTs 10s controlled by the control part CTC. Namely, the motor MOT is driven by having the control part CTC control the turning on/off of each IGBT 10.

When, as described above, the inverter INV through which relatively large currents for driving the motor MOT flow and the control part CTC through which relatively small currents representing, for example, control signals flow are electrically coupled to each other, noise may be generated on the control part CTC side.

In such a case, the reliability of the power conversion system can be improved by electrically insulating the inverter INV and the control part CTC from each other and inserting the photocouplers PCs having a function to transmit signals from the control part CTC to the inverter INV as shown in FIG. 1.

Thus, the function to transmit optical signals from the light emitting element side to the light receiving element side and the function to electrically isolate the light emitting element and the light receiving element from each other are among the basic functions required of each photocoupler PC.

<Photocoupler>

Figure 4:
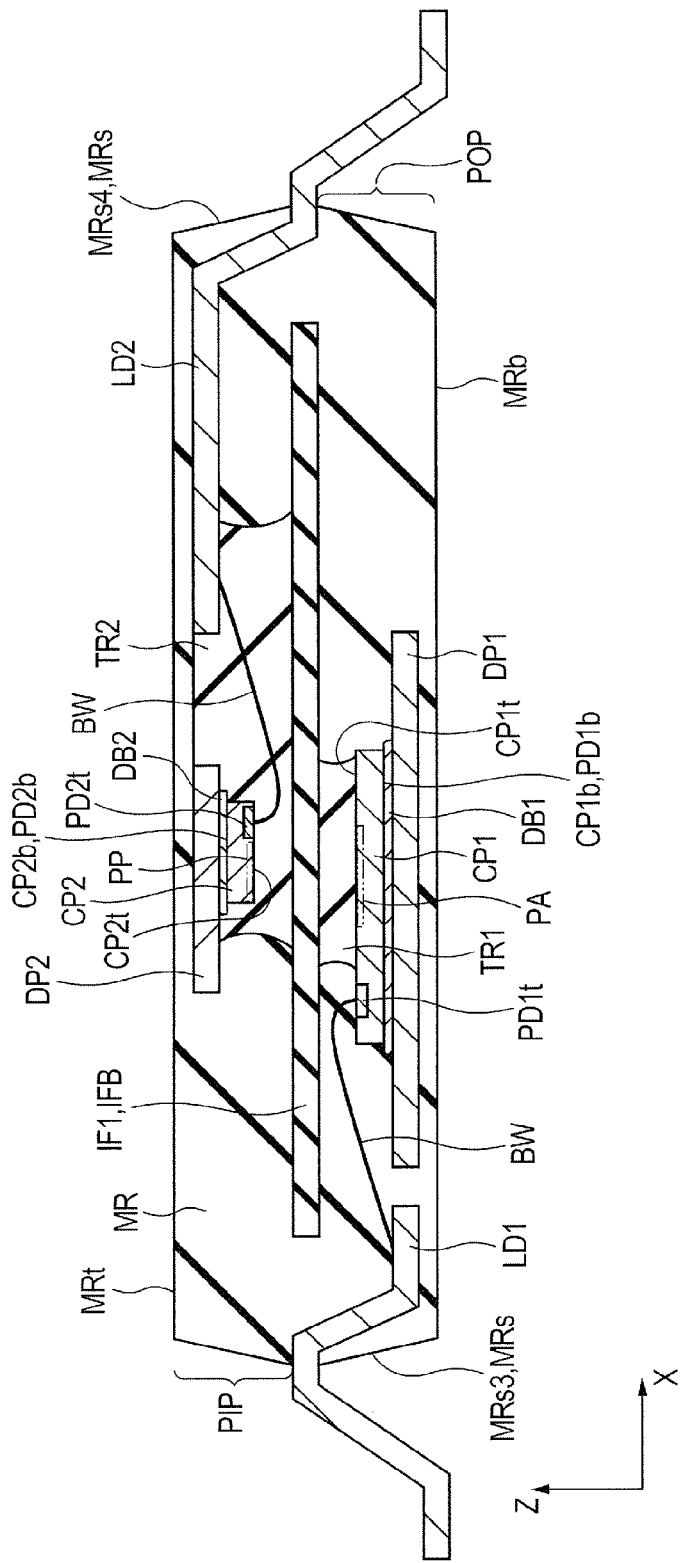
FIG. 4 is a sectional view taken along line B-B in FIG. 2
Figure 5:
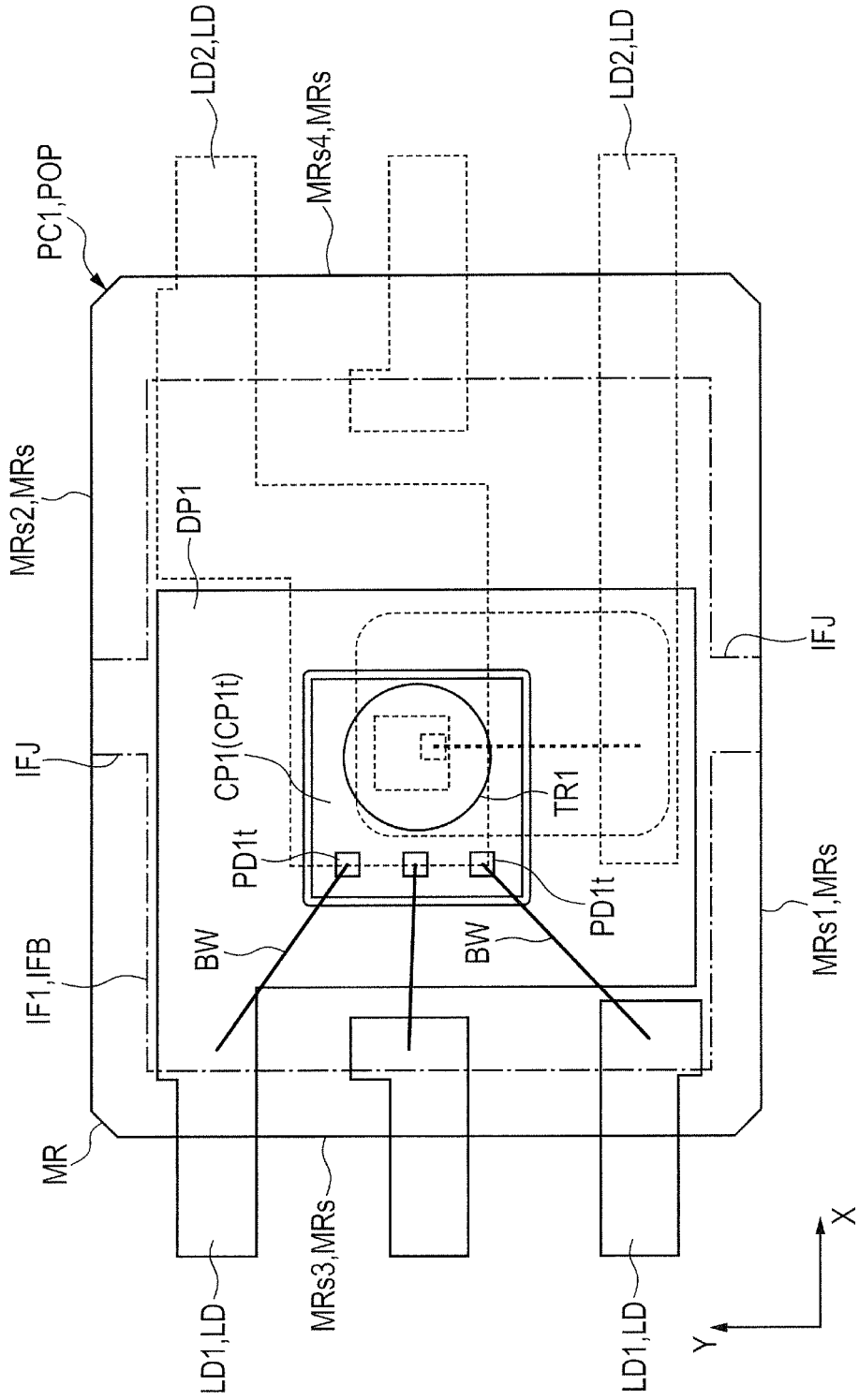
FIG. 5 is a plan view showing a planar structure of the photocoupler interior on the output part side with the sealed body shown in FIG. 2 represented transparently.
Figure 6:
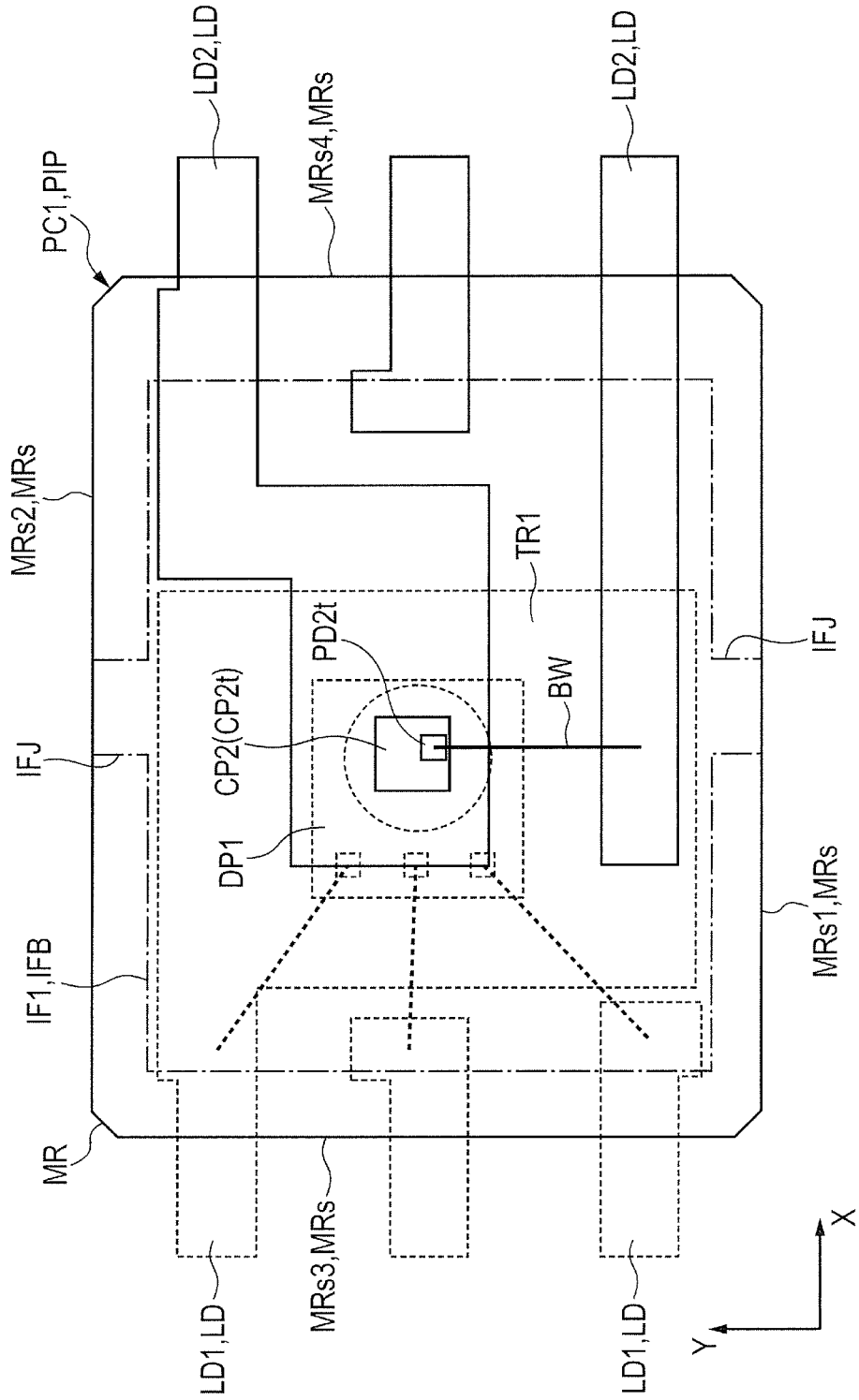
FIG. 6 is a plan view showing a planar structure of the photocoupler interior on the input part side with the sealed body shown in FIG. 2 represented transparently.

Next, the structure of a photocoupler PC1 representing an example of the photocouplers PCs shown in FIG. 1 as an embodiment of the present invention will be outlined in the following. FIG. 2 is a plan view showing an external structure of the photocoupler PC1 representing an example of the photocouplers PCs shown in FIG. 1. FIG. 3 is a sectional view taken along line A-A in FIG. 2. FIG. 4 is a sectional view taken along line B-B in FIG. 2. FIG. 5 and FIG. 6 are each a plan view showing a planar structure of the photocoupler PC1 with the sealed body shown in FIG. 2 represented transparently. In FIG. 5, for the sake of viewability, the components configuring an output part POP, the components configuring an input part PIP, and an insulating film IF1, all shown in FIG. 3, are represented in solid line, dotted line, and chain line, respectively.

As shown in FIG. 2, the photocoupler PC1 of the present embodiment has a rectangular sealed body (sealed part) MR as seen in an external plan view with plural leads LDs projecting from portions of plural side surfaces MRs's of the MR. The sealed body MR has a top surface MRt, a bottom surface MRb (see FIG. 3) opposite to the top surface MRt, and the four side surfaces MRs's positioned between the top surface MRt and the bottom surface MRb.

As shown in FIGS. 3 and 4, in the photocoupler (photocoupling device, semiconductor device) PC1, an output part (a first part) POP (see FIG. 3) including a light receiving chip CP1 which is a semiconductor chip on the light receiving side and an input part (a second part) PIP (see FIG. 3) including a light emitting chip CP2 which is a semiconductor chip on the light emitting side are positioned to oppose each other via the light-transmissive insulating film IF1. In the example shown in FIGS. 3 and 4, the output part POP is positioned on the bottom surface MRb side of the sealed body MR and the input part PIP is positioned on the top surface MRt side of the sealed body MR. Note, however, that, of the output part POP and the input part PIP, the one to be on the top surface side of the sealed body MR is not defined. As an example of modification of the structure shown in FIG. 3, the output part POP may be positioned on the top surface MRt side of the sealed body MR and the input part PIP may be positioned on the bottom surface MRb side of the sealed body MR.

The output part POP shown in FIGS. 3 and 4 includes a light receiving chip (semiconductor chip) CP1 over which a light receiving element (photonic device) PA is formed, a chip mounting part (die pad, island) DP1 mounted with the light receiving chip CP1, plural leads LD1s (see FIG. 5) electrically coupled with the light receiving chip CP1, and a light-transmissive resin TR1 covering the light receiving element PA.

The light receiving element PA is a photoelectric conversion element which receives optical signals and converts the optical signals into electrical signals. It is, for example, a photodiode or a phototransistor. The light receiving element PA is formed on the surface (main surface) CP1t side of the light receiving chip CP1.

The chip mounting part DP1 is a plate-like metal member formed of, for example, cupper (Cu). The light receiving chip CP1 is mounted over the chip mounting part DP1 with a back surface CP1b thereof opposing the chip mounting part DP1 via a die-bonding material DB1. The die-bonding material DB1 is a conductive adhesive material. A back-side electrode PD1b formed over a back side CP1B of the light receiving chip CP1 is electrically coupled to the metallic chip mounting part DP1 via the conductive die-bonding material DB1. Also, as shown in FIG. 5, the chip mounting part DP1 is formed integrally with one of the leads LD1s. Namely, the back-side electrode PD1b (see FIG. 3) of the light receiving chip CP1 is electrically coupled to the leads LD1s that are external terminals via the chip mounting part DP1.

As shown in FIGS. 4 and 5, surface electrodes PD1ts are formed over the surface CP1t of the light receiving chip CP1. In the example shown in FIG. 5, three surface electrodes (electrode pads) PD1ts are formed over the surface CP1t. The three surface electrodes PD1ts of the light receiving chip CP1 are electrically coupled to as many leads LD1s via as many wires BWs. The wires BWs are each a metallic linear member (a thin metallic line) made of, for example, gold (Au).

As shown in FIGS. 3 and 4, the light-transmissive resin TR1 is formed over the surface CP1t of the light receiving chip CP1. The light receiving element PA formed on the surface CP1t side of the light receiving chip CP1 is covered by the light-transmissive resin TR1. The light-transmissive resin TR1 is in close contact with the insulating film IF1 on the side thereof opposite to the side thereof in close contact with the light receiving chip CP1. Also, as shown in FIG. 4, the light-transmissive resin TR1 has a thickness exceeding the loop height of each wire BW, the loop height of each wire BW being the height from the interface of bonding between each wire BW and the surface electrode PD1t to the highest portion of each wire BW. As shown in FIG. 4, with the thickness of the light-transmissive resin TR1 exceeding the loop height of each wire BW, each wire BW is prevented from touching the insulating film IF1. Namely, the light-transmissive resin TR1 functions both as a protecting member to protect the light receiving element PA of the light receiving chip CP1 and as a support member to support the insulating film IF1.

To be capable of transmitting optical signals, the light-transmissive resin TR1 covering the light receiving element PA is required to be light-transmissive for optical signal wavelengths. The light-transmissive resin TR1 used in the present embodiment as meeting such a requirement is a silicone resin which is a synthetic high polymer having a siloxane bond as a main skeleton.

The input part PIP shown in FIGS. 3 and 4 includes the light emitting chip (semiconductor chip) CP2 over which a light emitting element (photonic device) PP is formed, a chip mounting part (die pad, island) DP2 mounted with the light emitting chip CP2, plural leads LD2s (see FIG. 6) electrically coupled with the light emitting chip CP2, and a light-transmissive resin TR2 covering the light emitting element PP.

The light emitting element PP converts electrical signals into optical signals and outputs the optical signals. It is, for example, a light emitting diode. The light emitting element PP is formed on the surface (main surface) CP2t side of the light emitting chip CP2.

The chip mounting part DP2 is a plate-like metal member formed of, for example, cupper (Cu). The light emitting chip CP2 is mounted over the chip mounting part DP2 with a back surface CP2b thereof opposing the chip mounting part DP2 via a die-bonding material DB2. The die-bonding material DB2 is a conductive adhesive material. A back-side electrode PD2b formed over a back side CP2B of the light emitting chip CP2 is electrically coupled to the metallic chip mounting part DP2 via the conductive die-bonding material DB2. Also, as shown in FIG. 6, the chip mounting part DP2 is formed integrally with one of the leads LD2s. Namely, the back-side electrode PD2b (see FIG. 3) of the light emitting chip CP2 is electrically coupled to the leads LD2s that are external terminals via the chip mounting part DP2.

As shown in FIGS. 4 and 6, a surface electrode PD2t is formed over the surface CP2t of the light emitting chip CP2. In the example shown in FIG. 6, a surface electrode (electrode pad) PD2t is formed over the surface CP2t. The surface electrode PD2t of the light emitting chip CP2 is electrically coupled to one of the leads LD2s via a wire BW. The wire BW is a metallic linear member (a thin metallic line) made of, for example, gold (Au).

As shown in FIGS. 3 and 4, the light-transmissive resin TR2 is formed over the surface CP2t of the light emitting chip CP2. The light-transmissive resin TR2 is, for example, a silicone resin like the light-transmissive resin TR1.

The light emitting element PP formed on the surface CP2t side of the light emitting chip CP2 is covered by the light-transmissive resin TR2. The light-transmissive resin TR2 is in close contact with the insulating film IF1 on a side thereof opposite to the side thereof in close contact with the light emitting chip CP2. Also, as shown in FIG. 4, the light-transmissive resin TR2 has a thickness exceeding the loop height of the wire BW. Therefore, the wire BW is prevented from touching the insulating film IF1. Namely, the light-transmissive resin TR2 functions both as a protecting member to protect the light emitting element PP of the light emitting chip CP2 and as a support member to support the insulating film IF1.

As can be seen by comparing FIG. 5 and FIG. 6, the surface CP2t of the light emitting chip CP2 is smaller in area than the surface CP1t of the light receiving chip CP1. As shown in FIG. 6, in the example of the present embodiment, the surface CP2t of the light emitting chip CP2 is entirely covered by the light-transmissive resin TR2. Also, in the example of the present embodiment, the wire BW coupled to the light emitting chip CP2 is also entirely covered by the light-transmissive resin TR2. However, an alternative arrangement is also allowable as a modified embodiment such that the light-transmissive resin TR2, like the light-transmissive resin TR1 partly covering the light receiving chip CP1, is formed to cover only a portion of the surface CP2t of the light emitting chip CP2 or such that the light-transmissive resin TR1 is formed to entirely cover the surface CP1t of the light receiving chip CP1.

The insulating film IF1 positioned between the output part POP and the input part PIP is required to transmit optical signals, so that it is formed of a light-transmissive material, for example, a polyimide resin.

As shown in FIG. 4, the light receiving chip CP1, the chip mounting part DP1, a portion (an inner lead portion) of each lead LD1, the light-transmissive resin TR1, the light emitting chip CP2, the chip mounting part DP2, a portion (an inner lead portion) of each lead LD2, the light-transmissive resin TR2, and the insulating film IF1 are sealed by the sealed body MR formed of a resin.

The sealed body MR is formed of a thermosetting resin, for example, an epoxy resin mixed with filler particles of plural kinds including, for example, silica particles. The sealed body MR also contains black particles such as carbon particles . It is a light blocking material lower in light transmissivity than the light-transmissive resins TR1 and TR2. In this way, with the light receiving element PA and the light emitting element PP coupled via a transparent material and sealed by a light blocking material surrounding them, the effects of noise on the optical signals transmitted between them can be reduced.

The insulating film IF1 includes a body part IFB positioned between the light receiving element PA and the light emitting element PP as shown in FIG. 4 and plural joining parts IFJs joined to the body part IFB as shown in FIGS. 5 and 6. In the example shown in FIGS. 5 and 6, the insulating film IF1 has two joining parts IFJs, and the end portion of each joining part IFJ is exposed at the side surface MRs on the corresponding side of the sealed body MR.

To be more specific, the sealed body MR has side surfaces MRs1, MRs2 opposite to MRs1, MRs3 positioned between MRs1 and MRs2, and MRs4 opposite to MRs3. Of the joining parts of the insulating film IF1, one is exposed at the side surface MRs1 of the sealed body MR, and the other is exposed at the side surface MRs2 of the sealed body MR.

The joining parts IFJs joined to the body part IFB of the insulating film IF1 are support members used for high-accuracy positioning of the body part IFB in a photocoupling device manufacturing process being described later. In the present embodiment, though details will be described later, the sealed body MR is formed in a state with the body part IFB of the insulating film IF1 supported by a frame part via the joining parts IFJs. The joining parts IFJs are subsequently cut off. Hence, in the photocoupler PC1 of the present embodiment, a portion (a cut surface) of each of the joining parts IFJs is exposed at the side surface MRs on the corresponding side of the sealed body MR.

<Manufacturing Process for Photocoupling Device>

The manufacturing process (assembly process) for the photocoupler PC1 shown in FIGS. 2 to 6 will be described in the following. The photocoupler PC1 shown in FIGS. 2 to 6 of the present embodiment is manufactured through the assembly process flow shown in FIG. 7. Regarding plan views or sectional views such as FIGS. 8, 10, 12, and 13 each showing an overall structure of, for example, a lead frame or an insulating film sheet which includes parts arranged like regularly repeated fine patterns, note that such parts are not entirely illustrated and that, out of such parts, only some typical ones are illustrated with the remaining ones represented by filled circles. This is to make features of such parts easier to recognize.

1. Output Part Assembly Process

Figure 7:
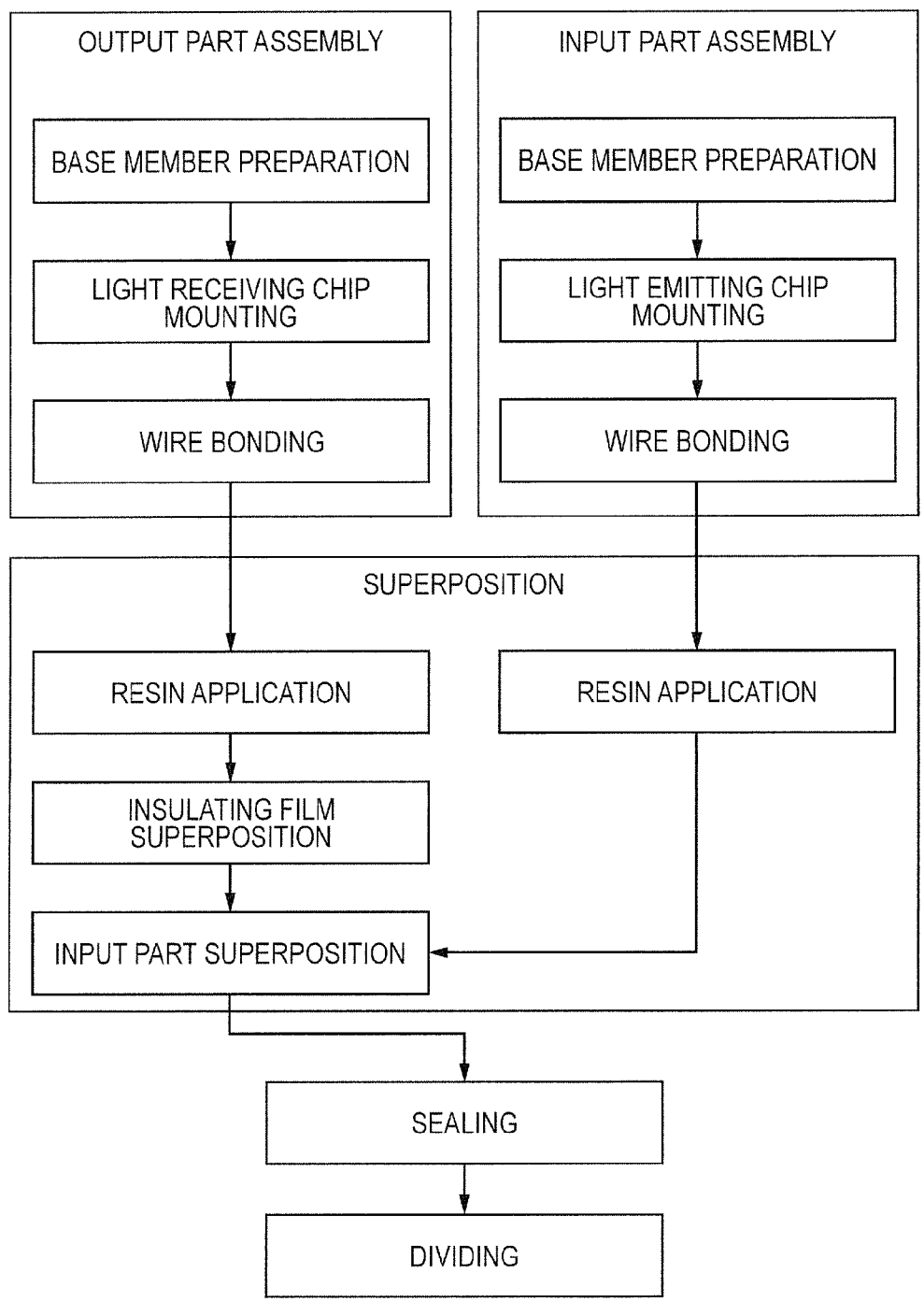
FIG. 7 shows an assembly process flow for the photocoupling device shown in FIGS. 2 to 6.
Figure 8:
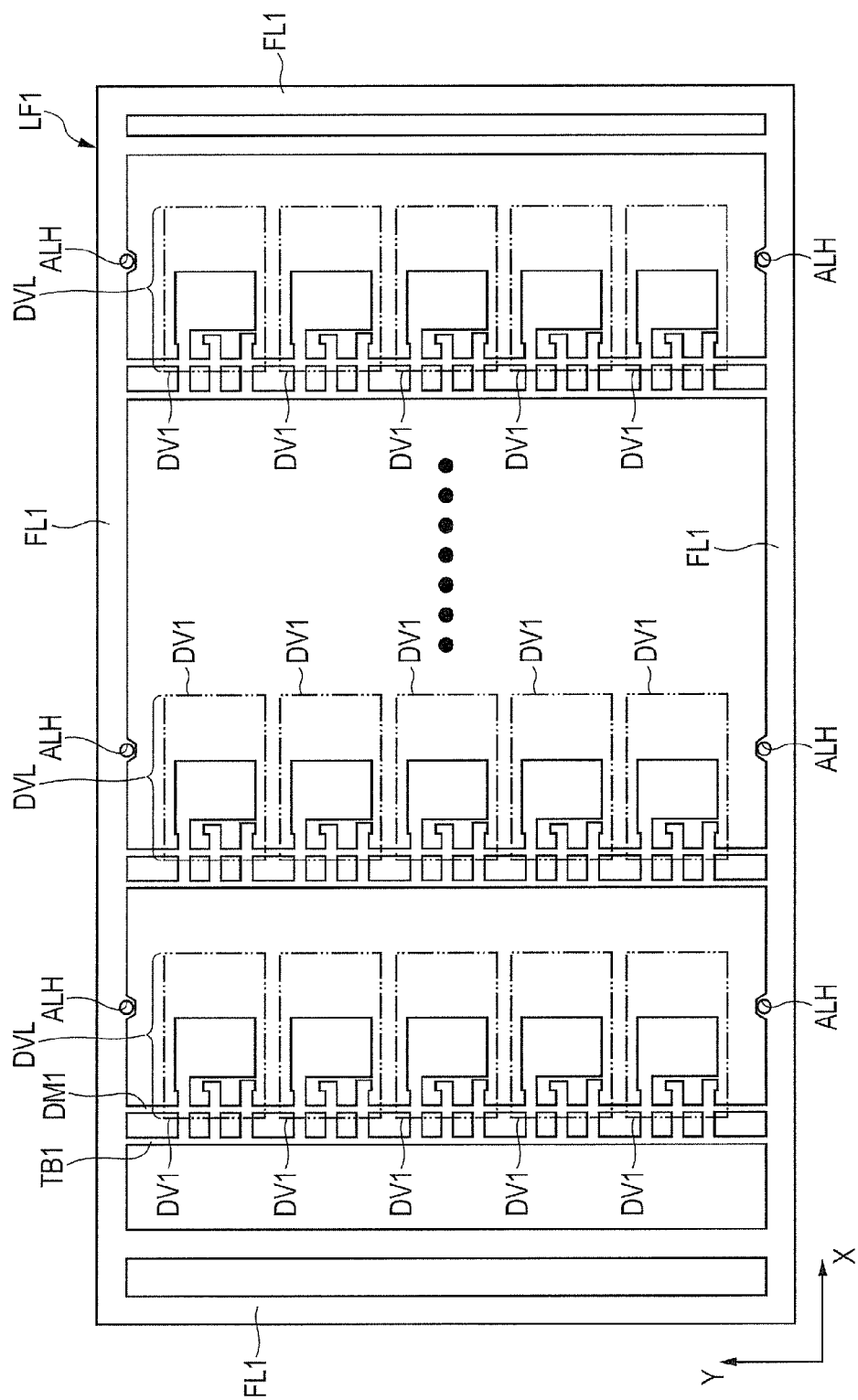
FIG. 8 is a plan view showing an overall structure of the lead frame to be prepared in the base member preparation process included in the output part assembly process shown in FIG. 7.
Figure 9:
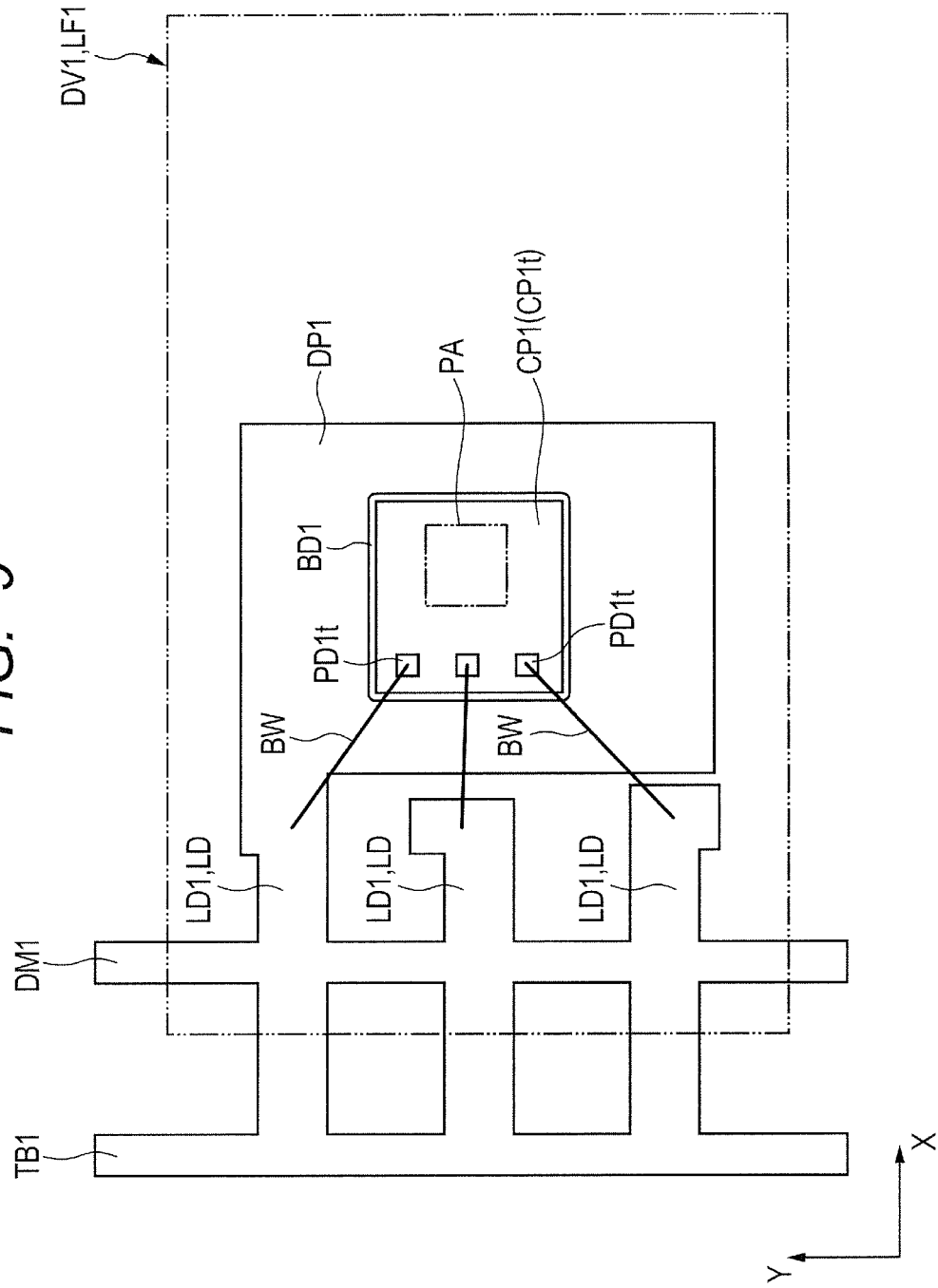
FIG. 9 is an enlarged plan view of a device forming part of the lead frame shown in FIG. 8.

In the output part assembly process shown in FIG. 7, an output part lead frame LF1 (see FIG. 8) is prepared by mounting the components of the output part POP shown in FIG. 5 over a lead frame. The light-transmissive resin TR1 shown in FIG. 5 is not yet applied in this process. It is applied in the resin application process shown in FIG. 7. FIG. 8 is a plan view showing an overall structure of the lead frame to be prepared in the base member preparation process included in the output part assembly process shown in FIG. 7. FIG. 9 is an enlarged plan view of a device forming part of the lead frame shown in FIG. 8. The plan view represents a state in which a light receiving chip mounted over a chip mounting part has been electrically coupled to plural leads.

In the output part assembly process shown in FIG. 7, first in the base member preparation process included therein, a lead frame (base member) LF1 as shown in FIG. 8 is prepared. The lead frame LF1 is a base member used to assemble an output part. It includes plural device forming parts DV1s arranged like a matrix as seen in a plan view and a frame part FL1 surrounding the device forming parts DV1s. The lead frame LF1 shown in FIG. 8 includes plural array lines DVLs each including five device forming parts DV1s arranged in a column direction (Y direction). In FIG. 8, three of the array lines DVLs included in the lead frame LF1 are shown as examples.

Each of the device forming parts DV1s included in the lead frame LF1 includes, as shown in FIG. 9, a chip mounting part DP1 where a light receiving chip CP1 is mounted and plural leads LD1s electrically coupled to the light receiving chip CP1. The plural leads LD1s are intercoupled via a tie bar TB1. In each device forming part DV1, a dam part DM1 is formed to block the spread of the resin in the sealing process shown in FIG. 7. The dam part DM1 is formed to extend between adjacent leads LD1s. Namely, the plural leads LD1s are intercoupled also via the dam part DM1.

As shown in FIG. 8, a tie bar TB1 and a dam part DM1 extend along each array line DVL including device forming parts DV1s and are coupled to the frame part FL1. Therefore, the chip mounting part DP1 and the leads LD1s shown in FIG. 9 are supported by the frame part FL1 via the tie bar TB1 and the dam part DM1.

Referring to FIG. 7, in the light receiving chip mounting process following the base member preparation process both included in the output part assembly process, a light receiving chip CP1 is mounted over the chip mounting part DP1 included in each device forming part DV1 as shown in FIG. 9. In the light receiving chip mounting process, the light receiving chip CP1 is, as described with reference to FIG. 3 in the foregoing, mounted over the chip mounting part DP1 with the back side CP1b thereof opposing the chip mounting part DP1 via the die-bonding material DB1. In this way, the light receiving chip CP1 is mounted over the chip mounting part DP1 with the light receiving element PA formed on the surface CP1t side facing up as schematically shown in FIG. 9.

Referring to FIG. 7, in the wire bonding process following the light receiving chip mounting process both included in the output part assembly process, the light receiving chip CP1 is electrically coupled with plural leads LD1s as shown in FIG. 9. In the wire bonding process, the surface electrodes PD1ts exposed on the surface CP1t of each light receiving chip CP1 are electrically coupled with the leads LD1s via the wires BWs.

Through the above processes, an output part lead frame LF1 is obtained which includes, as shown in FIG. 8, plural device forming parts DV1s each including, as shown in FIG. 9, a light receiving chip CP1 electrically coupled with plural leads LD1s.

2. Input Part Assembly Process

Figure 10:
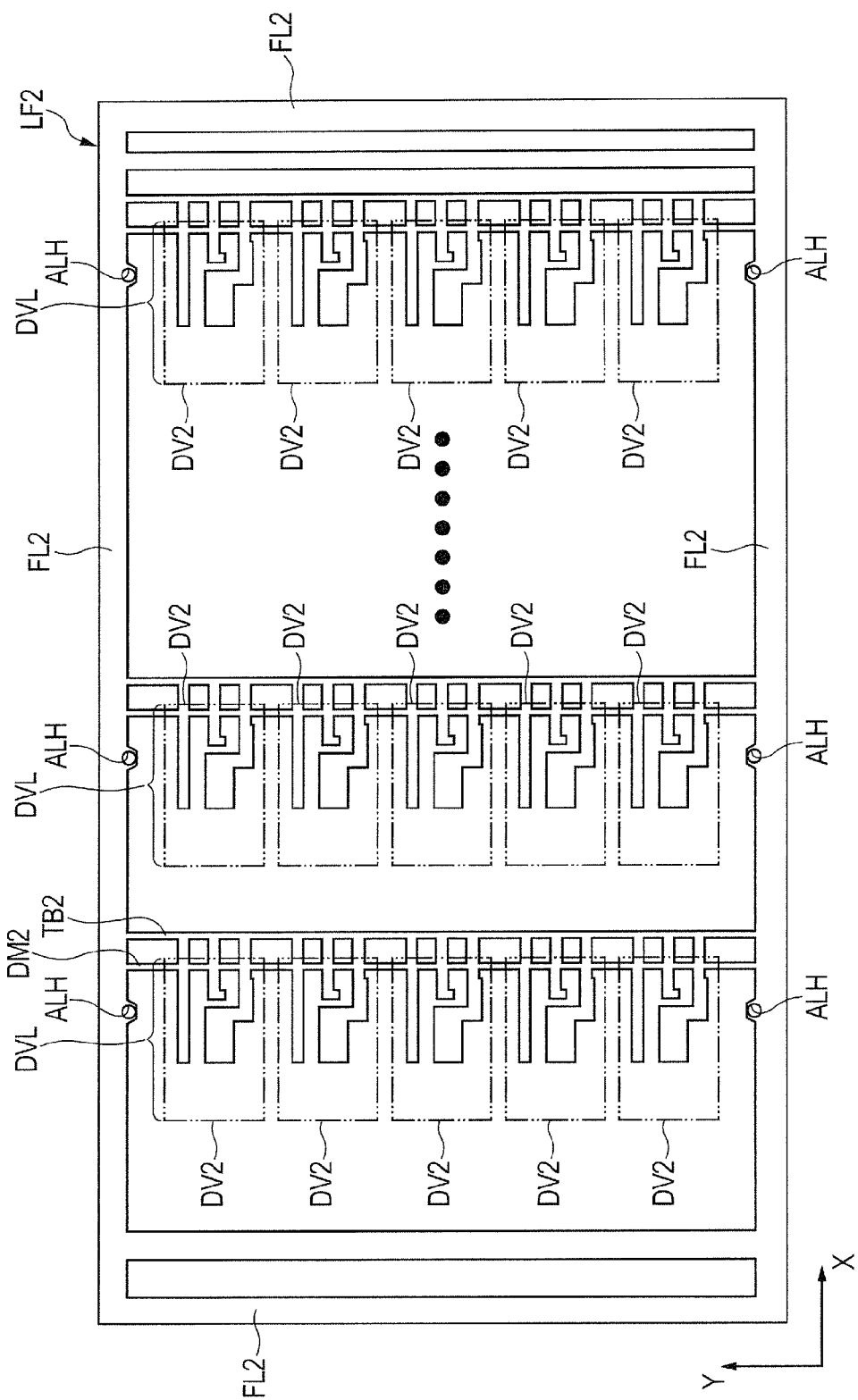
FIG. 10 is a plan view showing an overall structure of the lead frame to be prepared in the base member preparation process included in the input part assembly process shown in FIG. 7.
Figure 11:
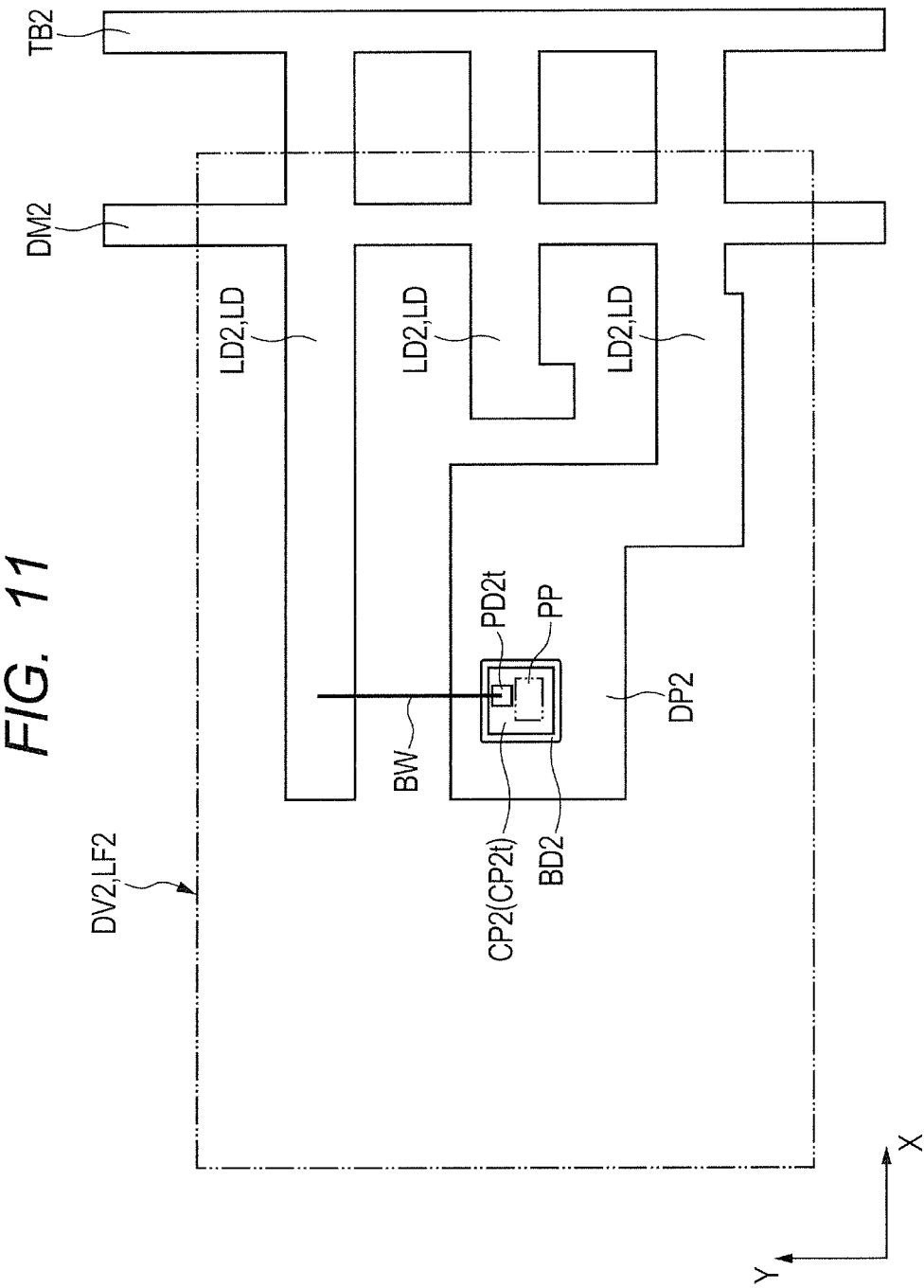
FIG. 11 is an enlarged plan view of a device forming part of the lead frame shown in FIG. 10.

In the input part assembly process shown in FIG. 7, an input part lead frame LF2 (see FIG. 10) is prepared by mounting the components of the input part PIP shown in FIG. 6 over a lead frame. The light-transmissive resin TR2 shown in FIG. 6 is not yet applied in this process. It is applied in the resin application process shown in FIG. 7. FIG. 10 is a plan view showing an overall structure of the lead frame to be prepared in the base member preparation process included in the input part assembly process shown in FIG. 7. FIG. 11 is an enlarged plan view of a device forming part of the lead frame shown in FIG. 10. The plan view represents a state in which alight emitting chip mounted over a chip mounting part has been electrically coupled to plural leads.

In the input part assembly process shown in FIG. 7, first in the base member preparation process included therein, a lead frame (base member) LF2 as shown in FIG. 10 is prepared. The lead frame LF2 is a base member used to assemble an input part. It includes plural device forming parts DV2s arranged like a matrix as seen in a plan view and a frame part FL2 surrounding the device forming parts DV2s. The lead frame LF2 shown in FIG. 10 includes plural array lines DVLs each including five device forming parts DV2s arranged in a column direction (Y direction). In FIG. 10, three of the array lines DVLs included in the lead frame LF2 are shown as examples.

Each of the device forming parts DV2s included in the lead frame LF2 includes, as shown in FIG. 11, a chip mounting part DP2 where a light receiving chip CP2 is mounted and plural leads LD2s electrically coupled to the light receiving chip CP2. The plural leads LD2s are intercoupled via a tie bar TB2. In each device forming part DV2, a dam part DM2 is formed to block the spread of the resin in the sealing process shown in FIG. 7. The dam part DM2 is formed to extend between adjacent leads LD2s. Namely, the plural leads LD2s are intercoupled also via the dam part DM2.

As shown in FIG. 10, a tie bar TB2 and a dam part DM2 extend along each array line DVL including device forming parts DV2s and are coupled to the frame part FL2. Therefore, the chip mounting part DP2 and the leads LD2s shown in FIG. 11 are supported by the frame part FL2 via the tie bar TB2 and the dam part DM2.

Referring to FIG. 7, in the light emitting chip mounting process following the base member preparation process both included in the input part assembly process, a light emitting chip CP2 is mounted over the chip mounting part DP2 included in each device forming part DV2 as shown in FIG. 11. In the light emitting chip mounting process, the light emitting chip CP2 is, as described with reference to FIG. 3 in the foregoing, mounted over the chip mounting part DP2 with the back side CP2b thereof opposing the chip mounting part DP2 via the die-bonding material DB2. In this way, the light emitting chip CP2 is mounted over the chip mounting part DP2 with the light emitting element PP formed on the surface CP2t side facing up as schematically shown in FIG. 11.

Referring to FIG. 7, in the wire bonding process following the light emitting chip mounting process both included in the input part assembly process, the light emitting chip CP2 is electrically coupled with plural leads LD2s as shown in FIG. 11. In the wire bonding process, the surface electrode PD2t exposed on the surface CP2t of each light emitting chip CP2 is electrically coupled with a lead LD2 via a wire BW.

Through the above processes, an input part lead frame LF2 is obtained which includes, as shown in FIG. 10, plural device forming parts DV2s each including, as shown in FIG. 11, a light receiving chip CP2 electrically coupled with plural leads LD2s.

3. Superposition Process

Figure 12:
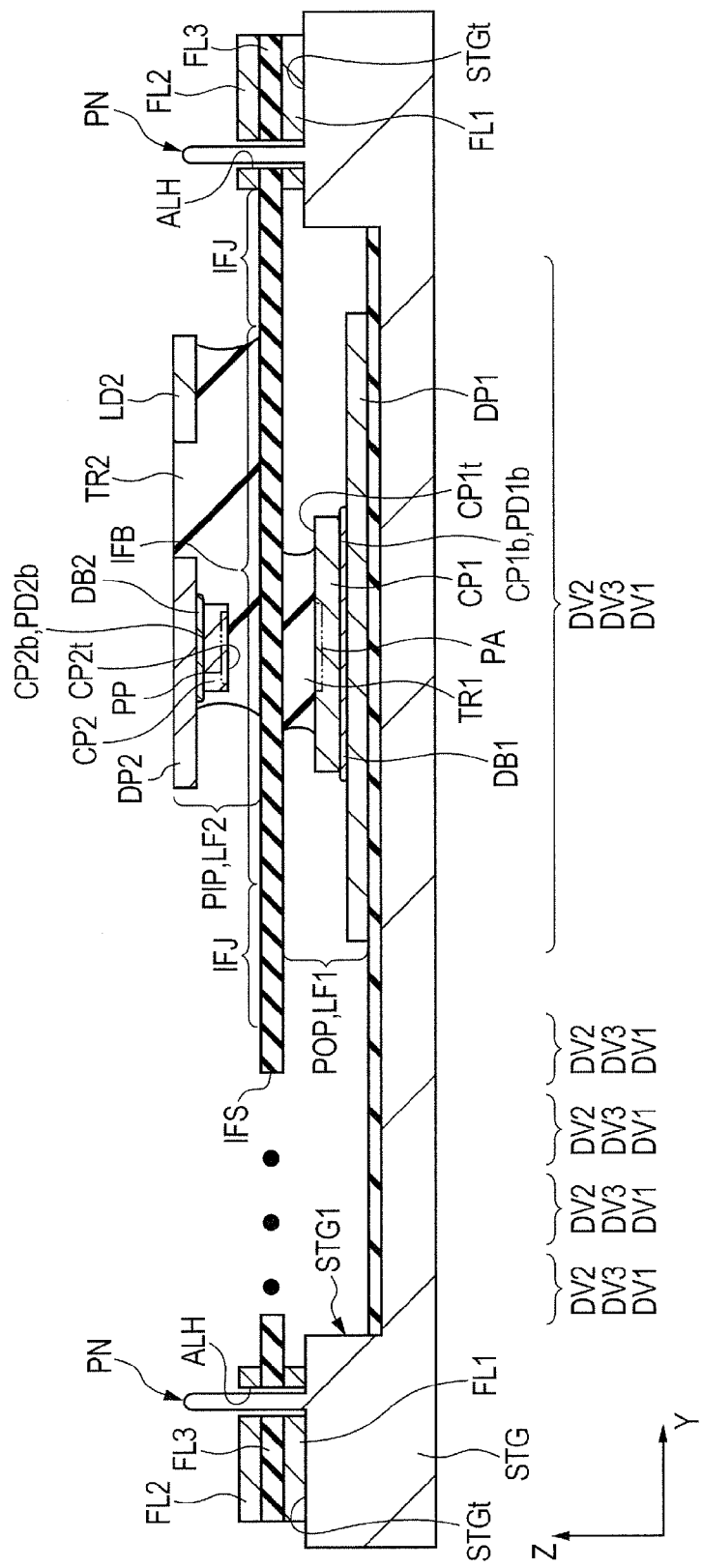
FIG. 12 is a sectional view showing an input part lead frame and an output part lead frame superposed via an insulating film sheet in the superposition process shown in FIG. 7.
Figure 13:
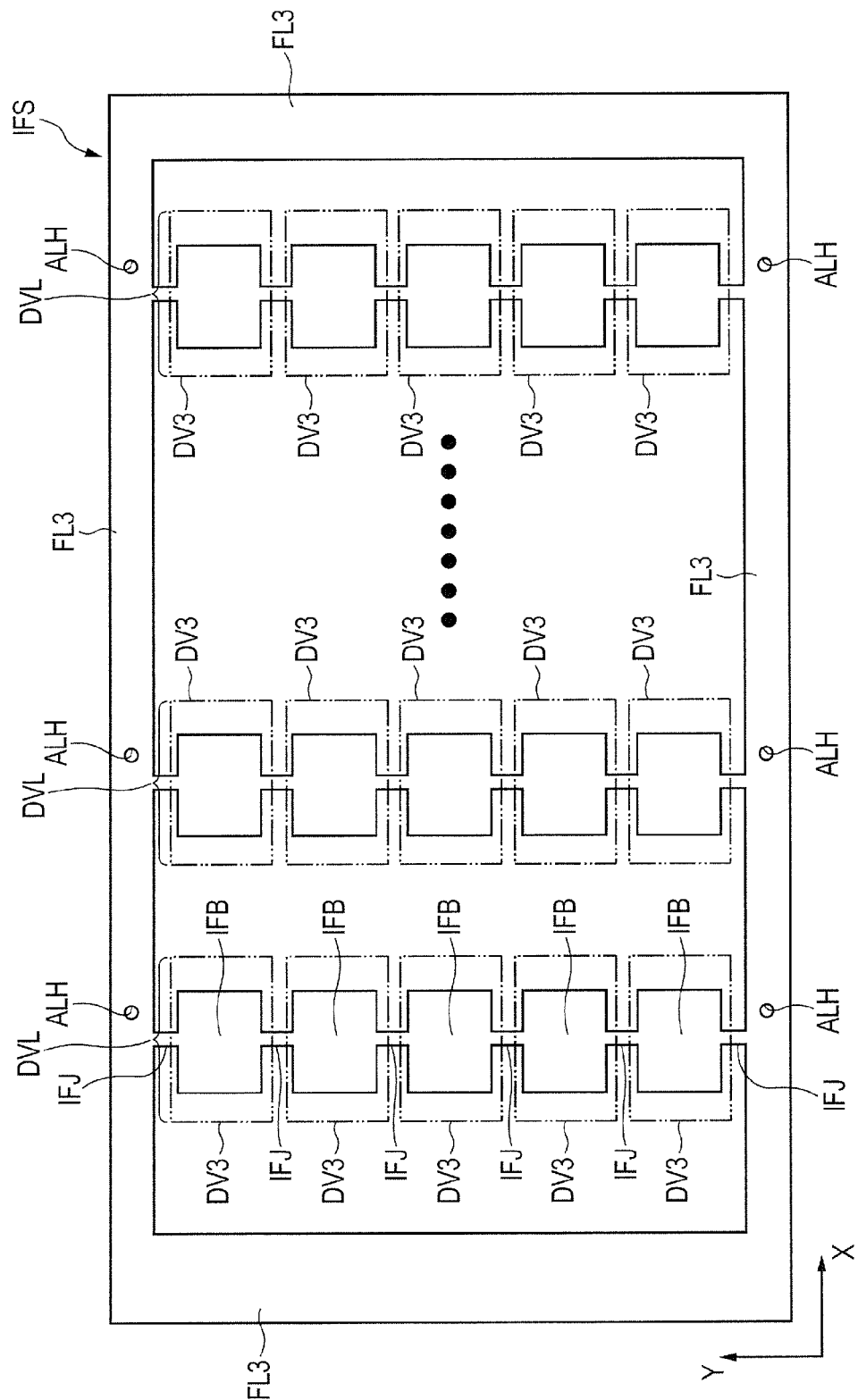
FIG. 13 is a plan view showing an overall structure of the insulating film sheet shown in FIG. 12.

Next, in the superposition process shown in FIG. 7, the lead frame LF1 shown in FIG. 9 and the lead frame LF2 shown in FIG. 11 are superposed. FIG. 12 is a sectional view showing an input part lead frame LF2 and an output part lead frame LF1 superposed via an insulating film sheet IFS in the superposition process shown in FIG. 7. FIG. 13 is a plan view showing an overall structure of the insulating film sheet IFS shown in FIG. 12.

In the superposition process, the lead frames LF1 and LF2 are superposed in a state with one of them turned over as shown in FIG. 12. This will be described in detail later. In the example shown in FIG. 12, a pair of lead frames LF1 and LF2 are superposed with the lead frame LF2 turned over. In this state, the light receiving element PA and the light emitting element PP oppose each other via the light-transmissive resin TR1 covering the light receiving element PA, the light-transmissive resin TR2 covering the light emitting element PP, and the light-transmissive, insulating film sheet IFS positioned between the light-transmissive resin TR1 and the light-transmissive resin TR2.

In the present embodiment, as shown in FIG. 13, the insulating film sheet IFS includes plural device forming parts DV3s each having a body part IFB. In the insulating film sheet IFS, the body parts IFBs are formed to be integral via joining parts IFJs. Namely, the insulating film sheet IFS includes the plural body parts IFBs that are placed, in the superposition process, between the plural light receiving elements PAs (see FIG. 12) and light emitting elements PPs (see FIG. 12) and the plural joining parts IFJs intercoupling the plural body parts IFB. The insulating film sheet IFS also has a frame part FL3 which surrounds the plural body parts IFBs and which is fixed, in the superposition process, between the frame part FL1 of the lead frame LF1 and the frame part FL2 of the lead frame LF2 as shown in FIG. 12.

In the superposition process, the lead frame LF1 shown in FIG. 8, the lead frame LF2 shown in FIG. 10, and the insulating film sheet IFS shown in FIG. 13 are superposed such that the device forming parts DV1s of the lead frame LF1, the device forming parts DV2s of the lead frame LF2, and the device forming parts DV3s of the insulating film sheet IFS are alignedly stacked. In this way, in each area where device forming parts DV1, DV2, and DV3 are stacked, a body part IFB is positioned between a light receiving element PA and a light emitting element PP as shown in FIG. 12.

In the superposition process, the body parts IFBs of the light-transmissive, insulating film sheet IFS are to be positioned between the light-transmissive resin TR1 and the light-transmissive resin TR2. As a method of achieving this, it may be considered to apply the light-transmissive resin TR1 shown in FIG. 12 to each of the device forming parts DV1s shown in FIG. 8 and position a discrete type of body part IFB on each of the device forming parts DV1s.

In the superposition process, however, it is necessary to superpose the body parts IFBs of the insulating film sheet IFS, the light-transmissive resin TR1, and the light-transmissive resin TR2 before the light-transmissive resin TR1 and the light-transmissive resin TR2 are cured. When discrete body parts IFBs are positioned on the light-transmissive resin TR1, the fluid light-transmissive resin TR1 may cause the discrete body parts IFBs to be displaced or rotated after being placed in position. Also, when discrete body parts IFBs are positioned on the light-transmissive resin TR1, they are supported by the light-transmissive resin TR1, so that, when the light-transmissive resin TR1 is deformed, the discrete body parts IFBs supported by the light-transmissive resin TR1 may be tilted relative to the surfaces CP1ts of the respective light receiving chip CP1s.

When, as in the present embodiment, the superposition process is performed for the device forming parts DV1s, DV2s, and DV3s at a time, placing a discrete body part IFB on every one of the plural device forming parts DV1s takes time and increases the risk of displacement.

According to the present embodiment on the other hand, the plural body parts IFBs are supported by the frame part FL3 as shown in FIG. 13. Namely, the body parts IFBs of the insulating film sheet IFS are not supported by the light transmissive resin TR1. Therefore, even if the light-transmissive resin TR1 is soft and easy to deform, the positions of the body parts IFBs are not affected. Thus, according to the present embodiment, the body parts IFBs are prevented from being displaced after they are alignedly positioned over the light-transmissive resin TR1.

Also, according to the present embodiment, with the frame part FL3 supporting the plural body parts IFBs, the positions of the body parts IFBs are fixed in the respective device forming parts DV3s included in the insulating film sheet IFS. Therefore, accurately aligning the frame parts FL1, FL2, and FL3 shown in FIG. 12 improves the accuracy of positioning of the body parts IFBs. Namely, according to the present embodiment, the accuracy of positioning between the light receiving elements PAs, the light emitting elements PPs, and the body parts IFBs of the insulating film sheet IFS can be improved.

Also, according to the present embodiment, with the body parts IFBs of the insulating film sheet IFS supported by the frame part FL3 as shown in FIG. 12, the wires BWs of each output part POP and the wire BW of each input part PIP are arranged, as shown in FIG. 4, not to easily touch the insulating film IF1. This inhibits the wires BWs from touching the insulating film IF1 and being thereby deformed.

Also, according to the present embodiment, the body parts IFBs of the insulating film sheet IFS are formed to be integrated via the joining parts IFJs. Therefore, aligning the positions of the lead frame LF1, the lead frame LF2, and the insulating film sheet IFS shown in FIG. 12 aligns the positions of the device forming parts DV1s, DV2s, and DV3s. Namely, according to the present embodiment, the positions of the device forming parts DV1s, DV2s, and DV3s can be aligned at a time to improve the efficiency of the superposition process.

Also, the insulating film sheet IFS according to the present embodiment includes, as shown in FIG. 13, plural array lines DVLs each including plural body parts IFBs arranged in the Y direction. The array lines DVLs are arranged to be separate from one another except that they are intercoupled via the frame part FL3. The joining parts IFJs are formed to join, in each array line DVL, the adjacent body parts IFBs along the array line DVL. In the example shown in FIG. 13, no joining parts IFJs are formed to join the adjacent array lines DVLs.

The leads LD1s shown in FIG. 9 and the leads LD2s shown in FIG. 11 respectively extend in the X direction perpendicular to the Y direction. Namely, the direction in which the joining parts IFJs shown in FIG. 13 extend differs from the direction in which the leads LD1s and the leads LD2s shown in FIGS. 9 and 11, respectively, extend.

As shown in FIG. 4, the leads LD1s and LD2s are each formed to have a portion as high (position in the Z direction in FIG. 4) as the insulating film IF1. Therefore, if the joining parts IFJs shown in FIG. 13 and the leads LD1s and the leads LD2s shown in FIGS. 9 and 11, respectively, all extend in a same direction, it is necessary to lay out the joining parts IFJs and the leads LD1s and LD2s not to allow them to mutually cross two-dimensionally.

According to the present embodiment, the direction in which the joining parts IFJs shown in FIG. 13 extend differs from the direction in which the leads LD1s and the leads LD2s shown in FIGS. 9 and 11, respectively, extend. In this way, there is not much necessity to give consideration to the layout of the joining parts IFJs and the leads LD1s and LD2s so as to avoid two-dimensional crossing between them. Hence, they can be laid out with increased flexibility. For example, in the present embodiment, the leads LD1s and LD2s and the joining parts IFJs are exposed at different side surfaces MRs's of the sealed body MR as shown in FIG. 5.

To be specific, of the two joining parts IFJs shown in FIG. 5 that are exposed from the sealed body MR, one is exposed at the side surface MRs1 and the other is exposed at the side surface MRs2. Also, the plural leads LD1s are exposed at the side surface MRs3 of the sealed body MR. The plural leads LD2s are exposed at the side surface MRs4 of the sealed body MR.

Figure 14:
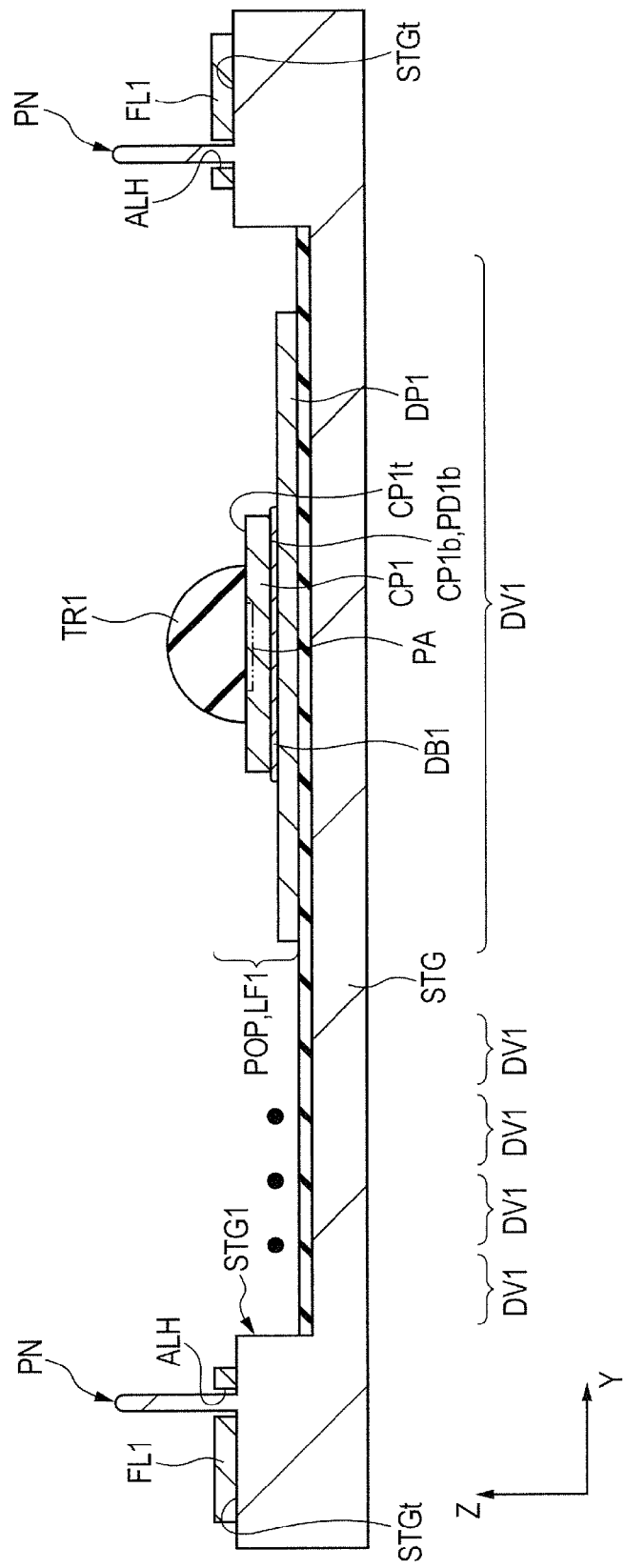
FIG. 14 is a sectional view showing a light receiving chip with a resin applied, in the resin application process shown in FIG. 7, over a surface thereof.
Figure 15:
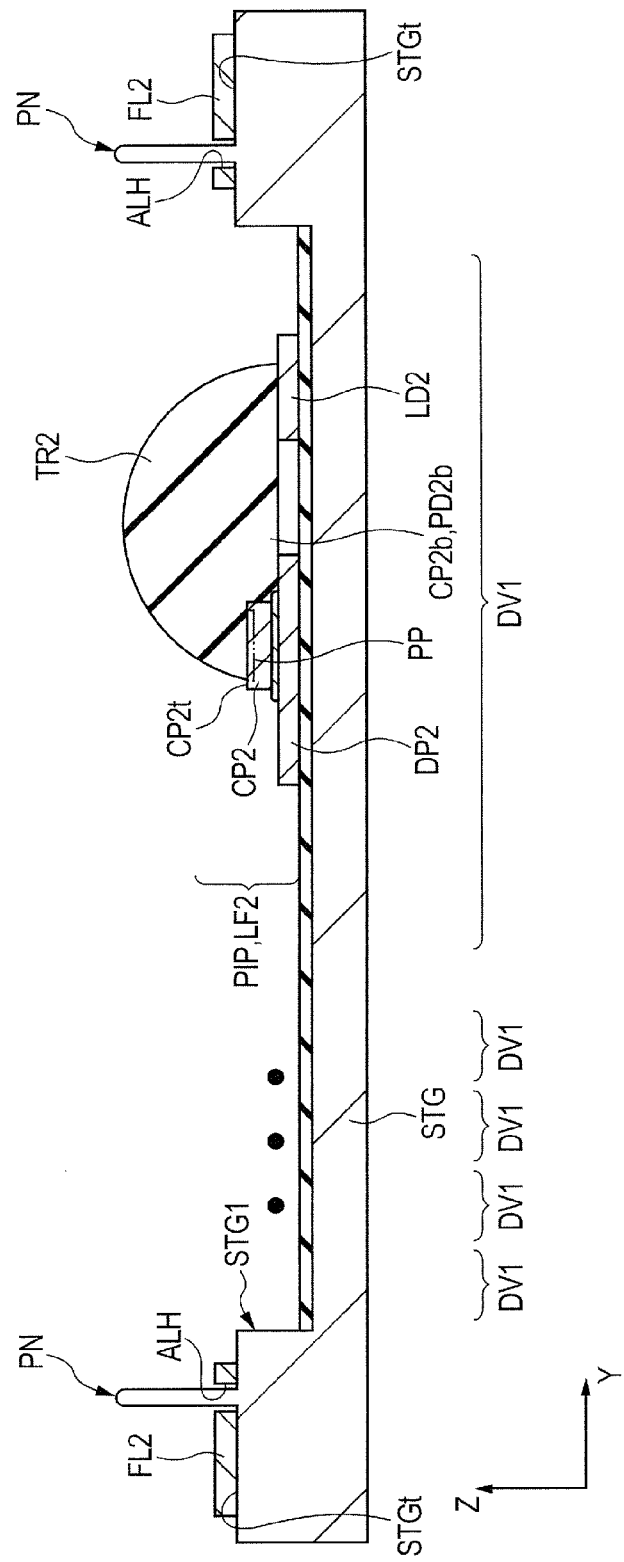
FIG. 15 is a sectional view showing a light emitting chip with a resin applied, in the resin application process shown in FIG. 7, over a surface thereof.

In the following, an example of the superposition process according to the present embodiment will be described with reference to the processing flow shown in FIG. 7. FIG. 14 is a sectional view showing a light receiving chip with a resin applied, in the resin application process shown in FIG. 7, over a surface thereof. FIG. 15 is a sectional view showing a light emitting chip with a resin applied, in the resin application process shown in FIG. 7, over a surface thereof.

In the superposition process shown in FIG. 7, first, as shown in FIG. 14, a pasty light-transmissive resin TR1 is applied over the light receiving chip CP1 mounted over the lead frame LF1 for the output part POP, thereby covering the light receiving element PA (resin application process, output part resin application process).

Also in the superposition process shown in FIG. 7, a pasty light-transmissive resin TR2 is applied over the light emitting chip CP2 mounted over the lead frame LF2 for the input part PIP as shown in FIG. 15, thereby covering the light emitting element PP (resin application process, input part resin application process).

The light-transmissive resin TR1 shown in FIG. 14 and the light-transmissive resin TR2 shown in FIG. 15 are, for example, silicone resins and have a certain degree of fluidity immediately after being applied. Hence, immediately after being applied, the light-transmissive resins TR1 and TR2 are each formed like a dome.

In the example shown in FIG. 14, the light-transmissive resin TR1 for the output part POP is applied over the surface CP1t of the light receiving chip CP1, and the portion around the light receiving chip CP1 of the chip mounting part DP1 is not covered by the light-transmissive resin TR1. In the example shown in FIG. 15, on the other hand, the light-transmissive resin TR2 for the input part PIP is applied over the light emitting chip CP2 such that it also covers a portion of the chip mounting part DP2 and a portion of each lead LD2. The amounts of the light-transmissive resins TR1 and TR2 may vary depending on the sizes of the target semiconductor chips and also the distance between the light receiving element PA and the light emitting element PP shown in FIG. 12.

The superposition process including the resin application process as shown in FIG. 7 is performed using a work stage STG as shown in FIGS. 12, 14, and 15. The work stage STG includes a concave accommodating part STG1 for accommodating the device forming parts DV1s or DV2s and a holding surface STGt for holding the frame part FL1 of the lead frame LF1 or the frame part FL2 of the lead frame LF2. The holding surface STGt has upright pins PNs formed thereover. The pins PNs are alignment jigs which are inserted through through-holes ALHs formed through the lead frame LF1, lead frame LF2, and insulating film sheet IFS so as to control their positional relationship.

The resin application process for the input part PIP shown in FIG. 15 may be performed at any time after the input part assembly process but before the input part superposition process shown in FIG. 7. In the present embodiment, during the input part superposition process shown in FIG. 7, the input part PIP shown in FIG. 15 is removed from the work stage STG and is turned over. Therefore, the resin application process for the input part PIP can also be performed other than on the work stage STG shown in FIG. 15.

Figure 16:
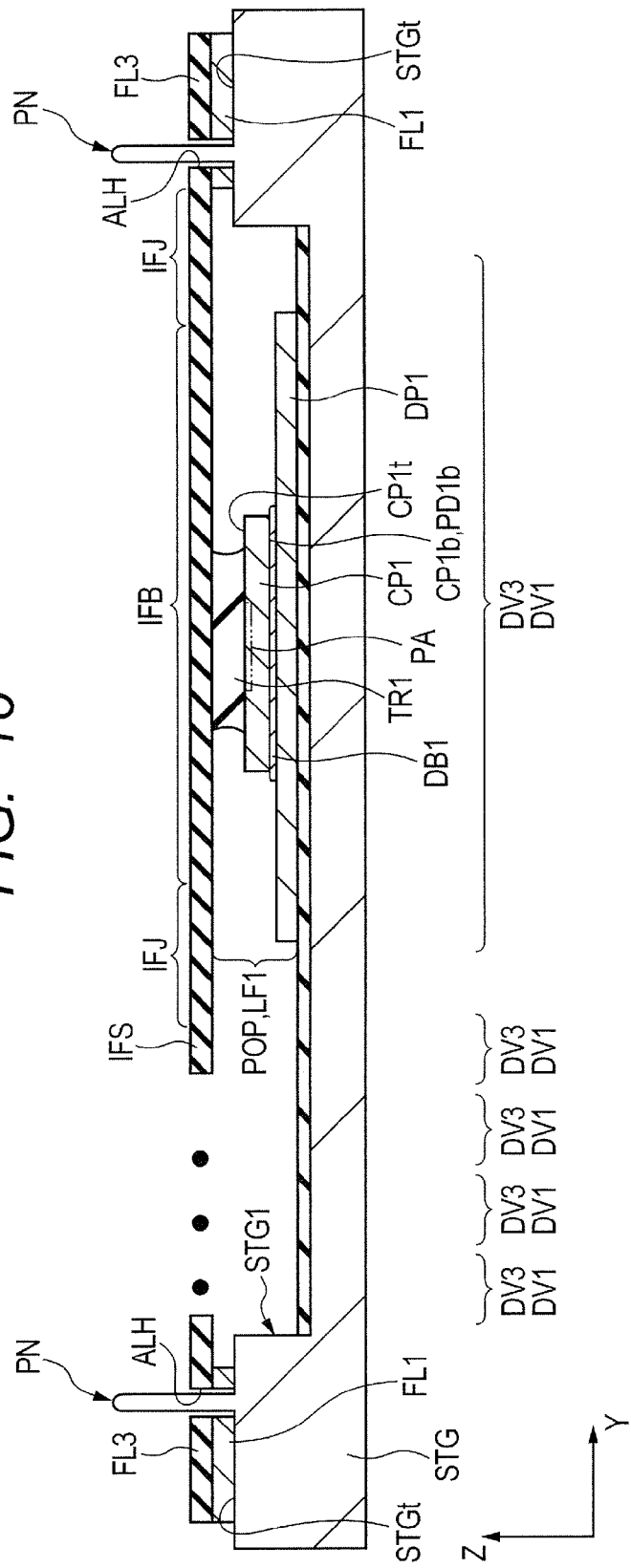
FIG. 16 is a sectional view showing the lead frame shown in FIG. 14 with an insulating film sheet superposed thereover.
Figure 17:
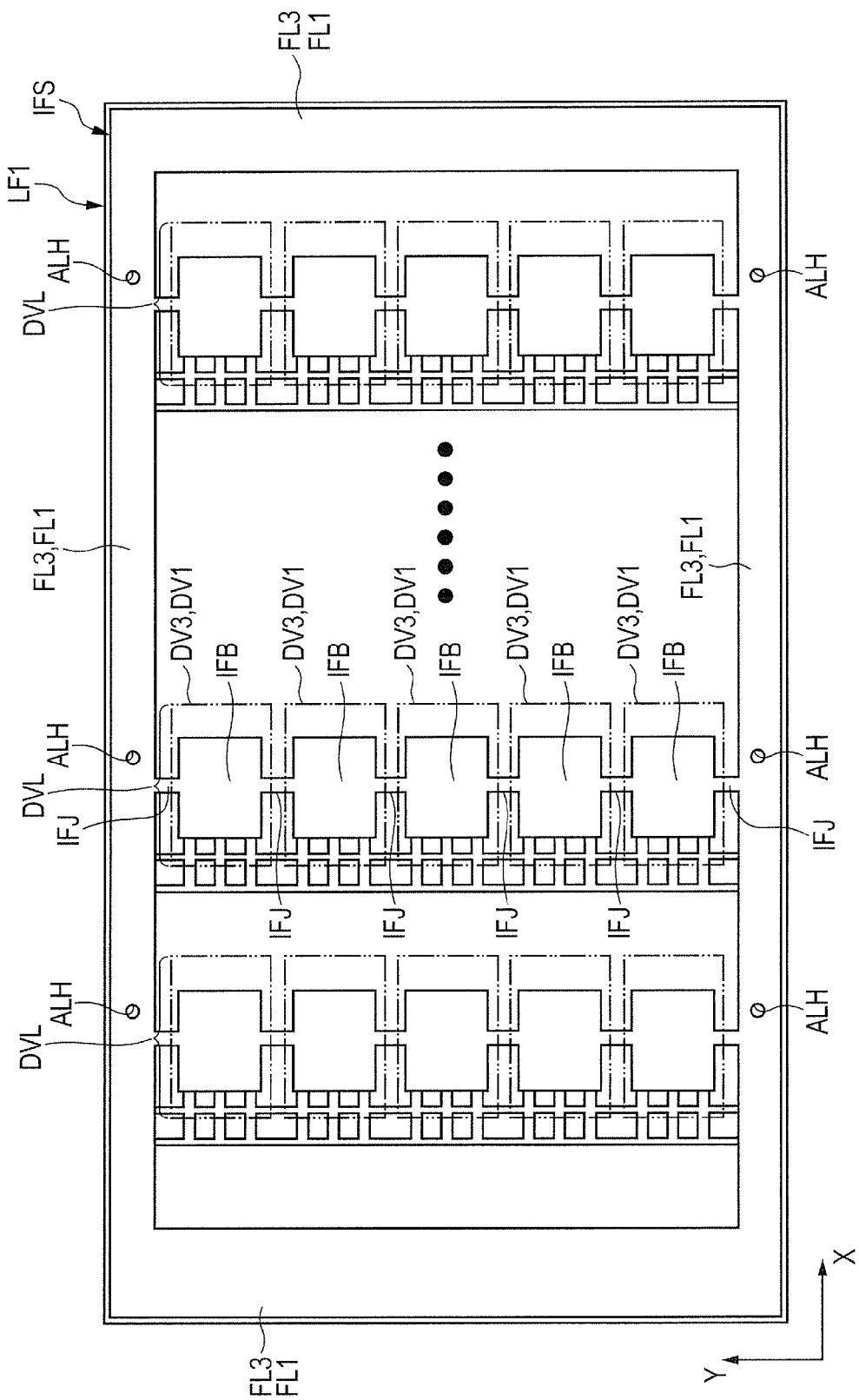
FIG. 17 is a plan view showing the two-dimensional, positional relationship between the lead frame with the insulating film sheet superposed thereover as shown in FIG. 16.

In the insulating film superposition process following the resin application process for the output part POP shown in FIG. 14 both included in the superposition process shown in FIG. 7, the insulating film sheet IFS is laid over the lead frame LF1 as shown in FIG. 16. FIG. 16 is a sectional view showing the lead frame LF1 shown in FIG. 14 with the insulating film sheet IFS superposed thereover. FIG. 17 is a plan view showing the two-dimensional, positional relationship between the lead frame LF1 with the insulating film sheet IFS superposed thereover as shown in FIG. 16.

In the insulating film superposition process, the insulating film sheet IFS is brought over the lead frame LF1 and is positioned such that, as shown in FIG. 16, the light receiving element PA and the body part IFB oppose each other. The frame part FL1 of the lead frame LF1 and the frame part FL3 of the insulating film sheet IFS have through-holes ALHs formed therethrough. In the insulating film superposition process, the plural pins (position alignment pins) PNs formed on the work stage STG are inserted through the through-holes ALHs for position alignment. The through-holes ALHs are each formed as an alignment part for adjusting the two-dimensional positional relationship between the lead frame LF1 and the insulating film sheet IFS. Namely, the through-holes ALHs are patterned such that aligning them aligns the positions of the device forming parts DV1s and DV3s. Therefore, when position alignment is performed in the insulating film superposition process, the device forming parts DV1s of the lead frame LF1 and the device forming parts DV3s of the film sheet IFS are aligned to overlap as shown in FIG. 17. In this state, the light receiving elements PAs (see FIG. 12) mounted in the device forming parts DV1s (see FIG. 12) and the body parts IFBs of the insulating film sheet IFS mutually oppose.

When, after position alignment is performed in the insulating film superposition process, the insulating film sheet IFS is brought close to the work stage STG shown in FIG. 16, the light-transmissive resin TR1 and the body parts IFBs of the insulating film sheet IFS come into close contact at the device forming parts DV1s and DV3s. At this time, the light-transmissive resin TR1 is still soft before being cured, so that it is deformed by being pressed between the body parts IFBs and the surface CP1t of each light receiving chip CP1. As a result, the light-transmissive resin TR1 spreads between the body parts IFBs and the light receiving chips CP1s, causing the distance between the body parts IFBs and the light receiving elements PAs to come into a predetermined range.

Figure 18:
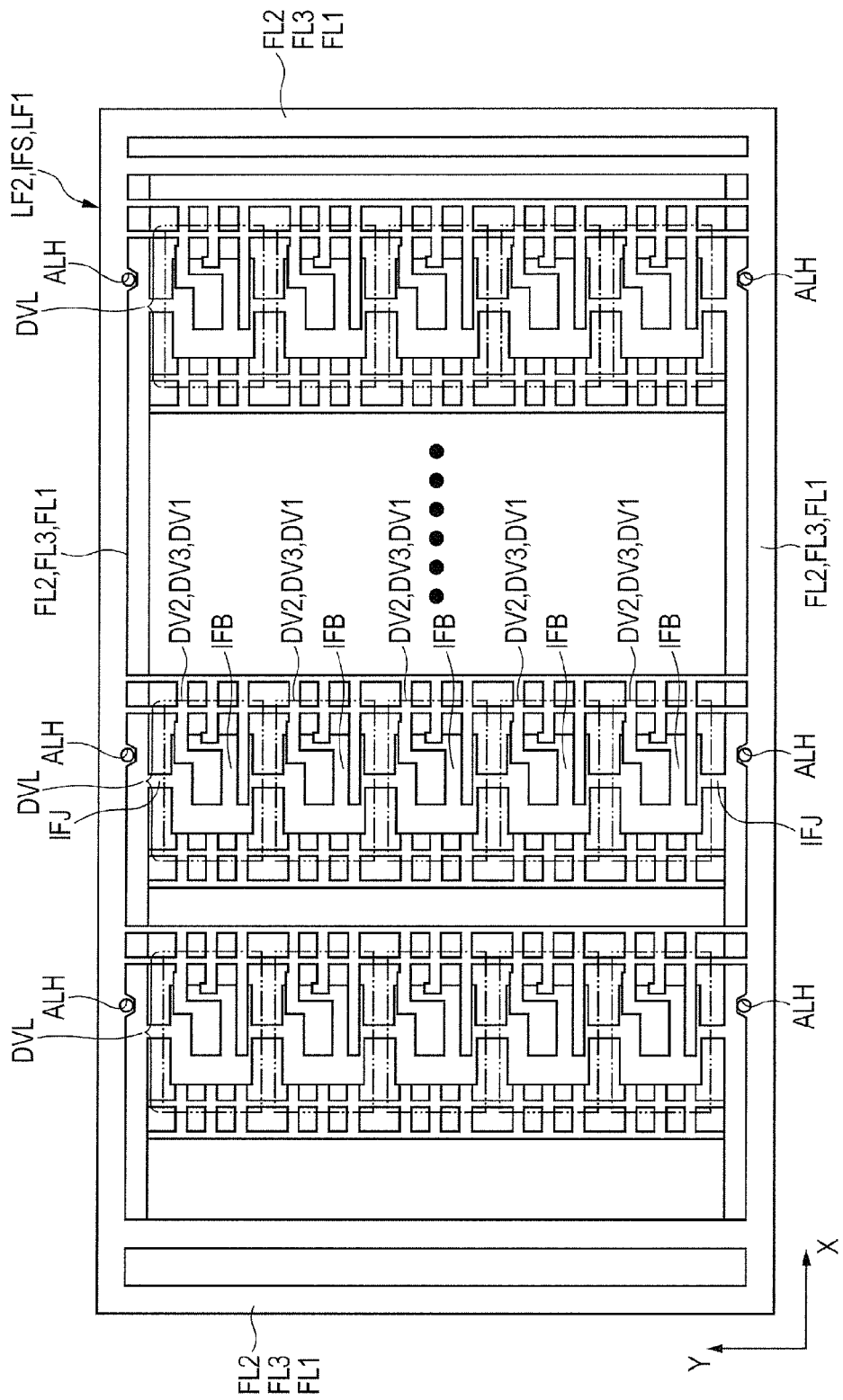
FIG. 18 is a plan view showing the two-dimensional, positional relationship between the two lead frames, including the one for the input part, and the insulating film superposed as shown in FIG. 12.

In the input part superposition process following the insulating film superposition process both included in the superposition process shown in FIG. 7, the turned-over lead frame LF2 is laid over the insulating film sheet IFS as shown in FIG. 12. FIG. 18 is a plan view showing the two-dimensional, positional relationship between the two lead frames, including the one for the input part, and the insulating film superposed as shown in FIG. 12.

In the input part superposition process, the lead frame LF2 is brought over the insulating film sheet IFS, then the lead frame LF2 is turned over as shown in FIG. 12 and its position is aligned such that the light emitting element PP and the body part IFB of the insulating film sheet IFS mutually oppose. The lead frame LF2 includes plural through-holes ALHs formed through the frame part FL2 thereof. In the input part superposition process, the position of the lead frame LF2 is aligned by inserting the plural pins (position alignment pins) PNs formed on the work stage STG through the plural through-holes ALHs formed through the frame part FL2. The through-holes ALHs are each formed as an alignment part for adjusting the two-dimensional positional relationship between the lead frame LF2 and the insulating film sheet IFS. Namely, the through-holes ALHs are patterned such that aligning them aligns the positions of the device forming parts DV1s, DV2s, and DV3s.

Therefore, when position alignment is performed in the input part superposition process, the device forming parts DV2s of the lead frame LF2 and the device forming parts DV3s of the film sheet IFS are aligned to overlap as shown in FIG. 17. In this state, the light emitting elements PPs mounted in the device forming parts DV2s and the body parts IFBs of the insulating film sheet IFS mutually oppose.

When, after position alignment is performed in the input part superposition process, the lead frame LF2 is brought close to the work stage STG shown in FIG. 12, the light-transmissive resin TR2 and the body parts IFBs of the insulating film sheet IFS come into close contact at the device forming parts DV2s and DV3s. At this time, the light-transmissive resin TR2 is still soft before being cured, so that it is deformed by being pressed between the body parts IFBs and the surface CP2t of each light emitting chip CP2. As a result, the light-transmissive resin TR2 spreads between the body parts IFBs and the light emitting chips CP2s, causing the distance between the body parts IFBs and the light emitting elements PPs to come into a predetermined range. In cases where, as in the example shown in FIG. 15, a portion of each chip mounting part DP2 and a portion of each lead LD2 are also covered by the light-transmissive resin TR2, part of the light-transmissive resin TR2 fills, in the input part superposition process, space between each chip mounting part DP2 and the corresponding leads LD2s as shown in FIG. 12.

After the input part superposition process included in the superposition process, the light-transmissive resin TR1 and the light-transmissive resin TR2 shown in FIG. 12 are cured, though this is not shown in FIG. 7. In the present example, for example, the light transmissive resin TR1 and the light-transmissive resin TR2 can be cured by heating.

4. Sealing Process

Figure 19:
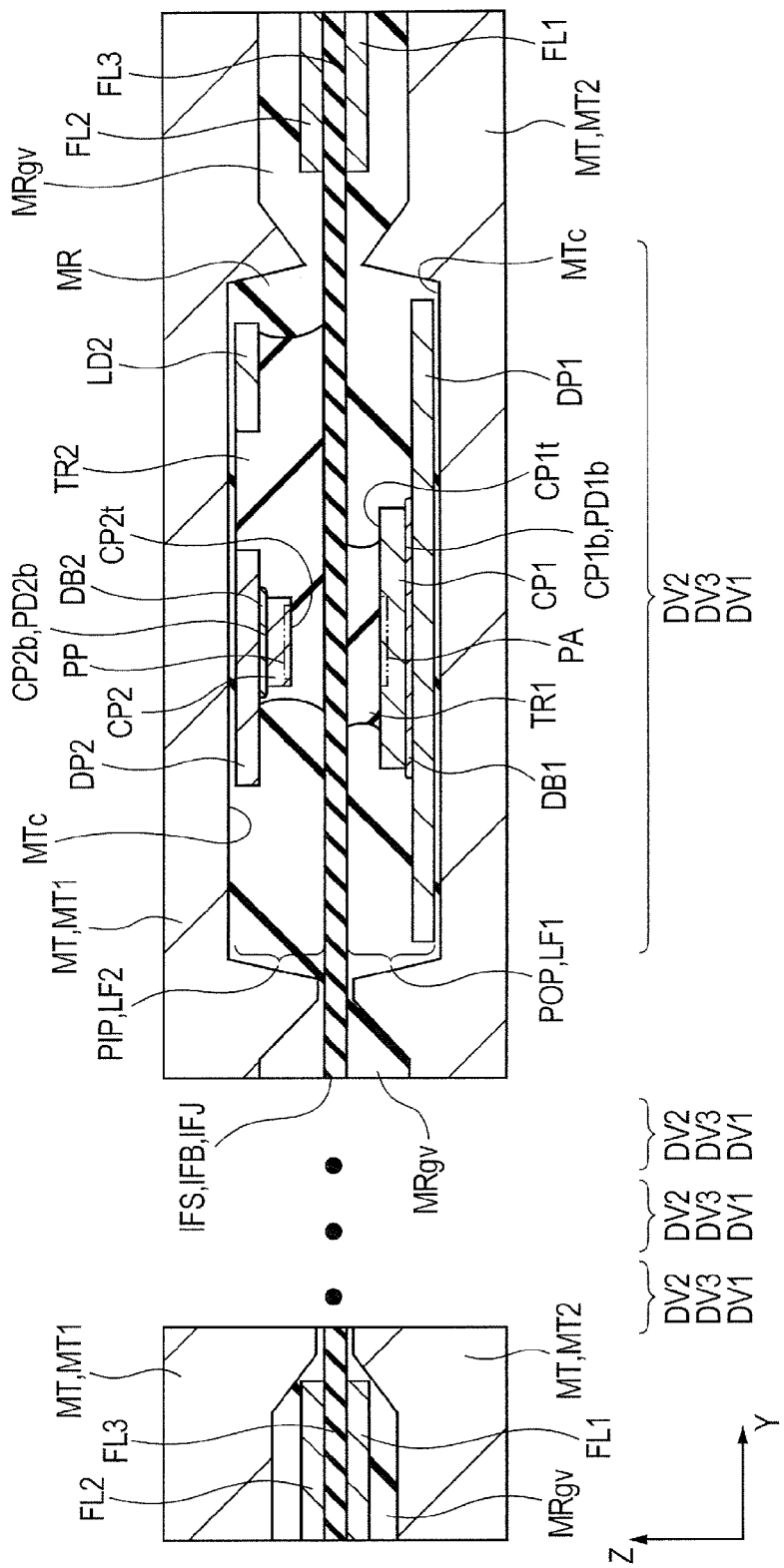
FIG. 19 is a sectional view showing the device forming parts shown in FIG. 12 in a state of being sealed inside a metal mold.
Figure 20:
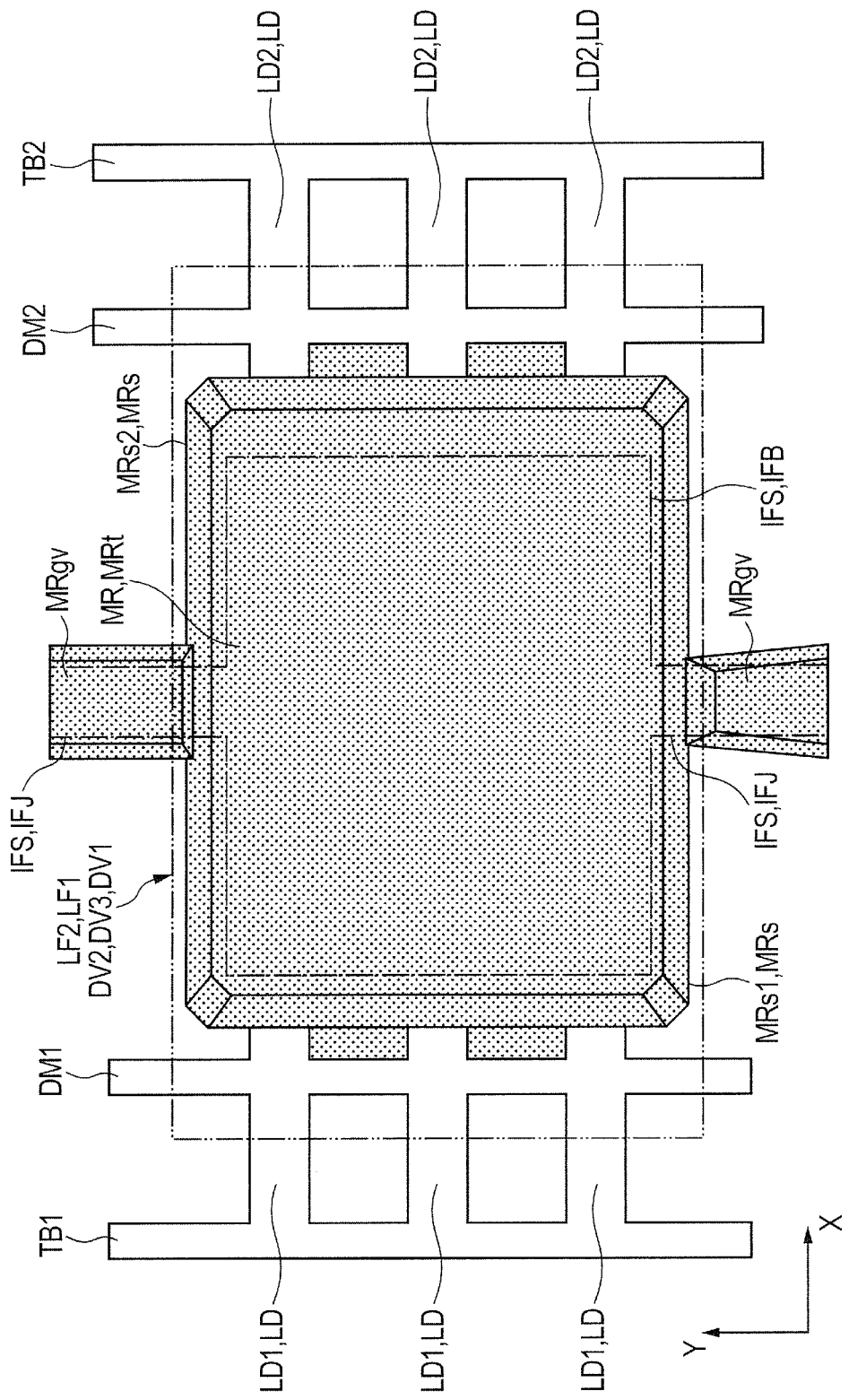
FIG. 20 is an enlarged plan view of a portion of the sealed body shown in FIG. 19.

In the sealing process shown in FIG. 7, the sealed body (sealed part) MR is formed as shown in FIG. 19. The sealed body MR is formed of resin and seals the light receiving chip CP1, the light emitting chip CP2, the chip mounting parts DP1 and DP2, portions of the plural leads LD1s (see FIG. 20), portions of the plural leads LD2s (see FIG. 20), and portions of the light-transmissive resin TR1, light-transmissive resin TR2 and insulating film sheet IFS. FIG. 19 is a sectional view showing the device forming parts shown in FIG. 12 in a state of being sealed with resin inside a metal mold. FIG. 20 is an enlarged plan view of a portion of the sealed body shown in FIG. 19.

In the sealing process, the lead frame LF1, the insulating film sheet IFS, and the lead frame LF2 are held inside a metal mold MT, that is, between an upper mold (a first mold) MT1 and a lower mold (a second mold) MT2 opposing the upper mold MT1 as shown in FIG. 19. In this state, resin (sealing resin) is supplied into a cavity MTc formed between the upper mold MT1 and the lower mold MT2 to, thereby, form the sealed body MR. This method in which the sealing resin is supplied into a space formed inside a metal mold to form a sealed body and subsequently cure the sealing resin is referred to as a transfer mold method.

In the sealing process, the sealing resin is supplied along each of the plural array lines DVLs shown in FIG. 18. In other words, in the sealing process, the sealing resin is supplied along the direction in which the plural joining parts IFJs of the insulating film sheet IFS extend. In the example shown in FIGS. 19 and 20, the sealing resin supply routes overlap the joining parts IFJs, so that the joining parts IFJs of the insulating film sheet IFS are covered by resin MRgv formed in the sealing resin supply routes.

Thus, in the sealing process, by supplying the sealing resin along the direction in which the joining parts IFJs of the insulating film sheet IFS extend, the array lines DVLs of the insulating film sheet IFS can be inhibited from being shifted by the sealing resin supply pressure.

Though not shown in FIG. 7, the sealing process includes a sealed part curing process in which the sealing resin supplied into the cavity MTc to be formed therein is cured. In the sealed part curing process, for example, the lead frame LF1 and the lead frame LF2 integrated with the plural sealed bodies MRs formed as described above are conveyed into a baking furnace, not shown, where they are heated to cure the thermosetting resin components contained in them.

Also, in cases where an outer metallic layer is to be formed by a plating method over the portions exposed from each sealed body MR of the plural leads LDs shown in FIG. 20, the portions are subjected to plating after the sealing process but before the dividing process.

5. Dividing Process

Next, in the dividing process shown in FIG. 7, the sealed bodies MRs each containing a set of device forming parts DV1, DV2, and DV3 are divided into individual devices by cutting off the leads LD1s and LD2s and the joining parts IFJ of the insulating film sheet IFS shown in FIG. 20.

In the dividing process, the dam part DM1 coupling the adjacent leads LD1s shown in FIG. 20 and the dam part DM2 coupling the adjacent leads LD2s also shown in FIG. 20 are cut off. Also, the leads LD1s and LD2s are cut to required lengths, thereby, separating them from the tie bars TB1 and TB2. The dam parts DM1 and DM2 and the leads LD1s and LD2s can be cut, for example, by press work using a punch and a die, not shown.

Also, in the dividing process, joining parts IFJs are cut off together with the resin MRgv along the side surfaces MRs1 and MRs2 of the sealed body MR. Like the leads LD1s and LD2s, the joining parts IFJs and the resin MRgv can also be cut off, for example, by press work. When the joining parts IFJs are cut off in the dividing process, the end faces of the remaining portions of the joining parts IFJs of the insulating film are exposed at the side surfaces MRs1 and MRs2 of the sealed body MR.

When it is necessary to bend the leads LD1s and LD2s projecting from the sealed body MR (outer lead portions) as shown in FIG. 4, they may be bent into desired shapes at the same time as or after they are cut off in the dividing process.

The photocouplers coming through the dividing process are subjected to necessary inspection and testing, for example, appearance inspection and electrical tests, then those having passed such inspection and tests are treated as finished photocouplers PC1s as shown in FIG. 2. The finished photocouplers PC1s are shipped as they are, or, for example, they are mounted on mounting boards, not shown, and are incorporated into power conversion systems like the one shown in FIG. 1.

Modification Examples

The invention made by the present inventors has been described in concrete terms based on an embodiment, but the invention is not limited to the embodiment and can be modified in various ways without departing from its scope.

Modification Example 1

In the foregoing embodiment, the lead frame LF1, the insulating film sheet IFS, and the lead frame LF2 are positionally aligned by inserting the position alignment pins through the through-holes ALHs formed through them as shown in FIG. 12. However, an alternative position alignment method may be used as long as the positions of the lead frame LF1, the insulating film sheet IFS, and the lead frame LF2 can be two-dimensionally controlled with high accuracy.

For example, the lead frame LF1, the insulating film sheet IFS, and the lead frame LF2 may respectively have alignment marks formed thereon beforehand and can be aligned based on the alignment marks recognized using sensors.

However, considering that the lead frame LF1, the insulating film sheet IFS, and the lead frame LF2 can be accurately aligned using simple jigs as in the foregoing example, it is preferable to use the alignment method used in the foregoing embodiment in which the plural alignment pins PNs are inserted through the plural through-holes ALHs.

Modification Example 2

Also, in the foregoing embodiment, through-holes ALHs are formed as alignment parts on both end sides of each of the plural array lines DVLs as shown in FIG. 13. However, with the lead frame LF1, the insulating film sheet IFS, and the lead frame LF2 each formed as a single-body part, their positions can be aligned if they each have through-holes ALHs formed in two optional portions thereof.

However, the insulating film sheet IFS being a resin film sheet is less stiffer than the metallic lead frames LF1 and LF2. Therefore, from the viewpoint of improving the accuracy of two-dimensional positional alignment of the insulating film sheet IFS with low stiffness, it is desirable to make positional alignment based on locations near where plural body parts IFBs are formed as shown in FIG. 13.

Thus, from the viewpoint of improving the accuracy of positional alignment of the insulating film sheet IFS, each of the lead frame LF1, the insulating film sheet IFS, and the lead frame LF2 preferably has, as in the foregoing embodiment, through-holes ALHs formed on both end sides of each of the plural array lines DVLs.

Modification Example 3

Figure 21:
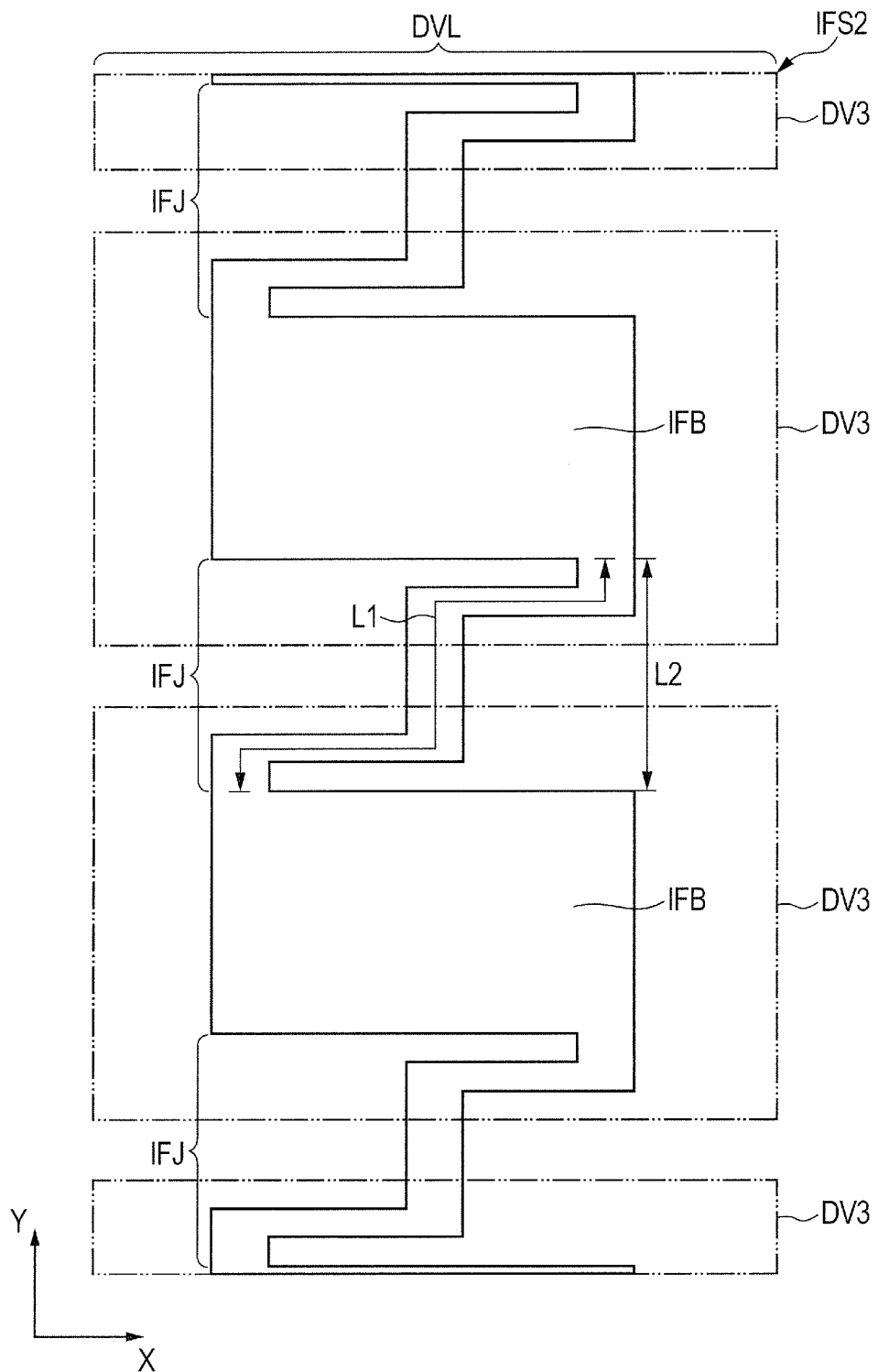
FIG. 21 is an enlarged plan view of a portion of an insulating film sheet representing a modification to the insulating film sheet shown in FIG. 13.
Figure 22:
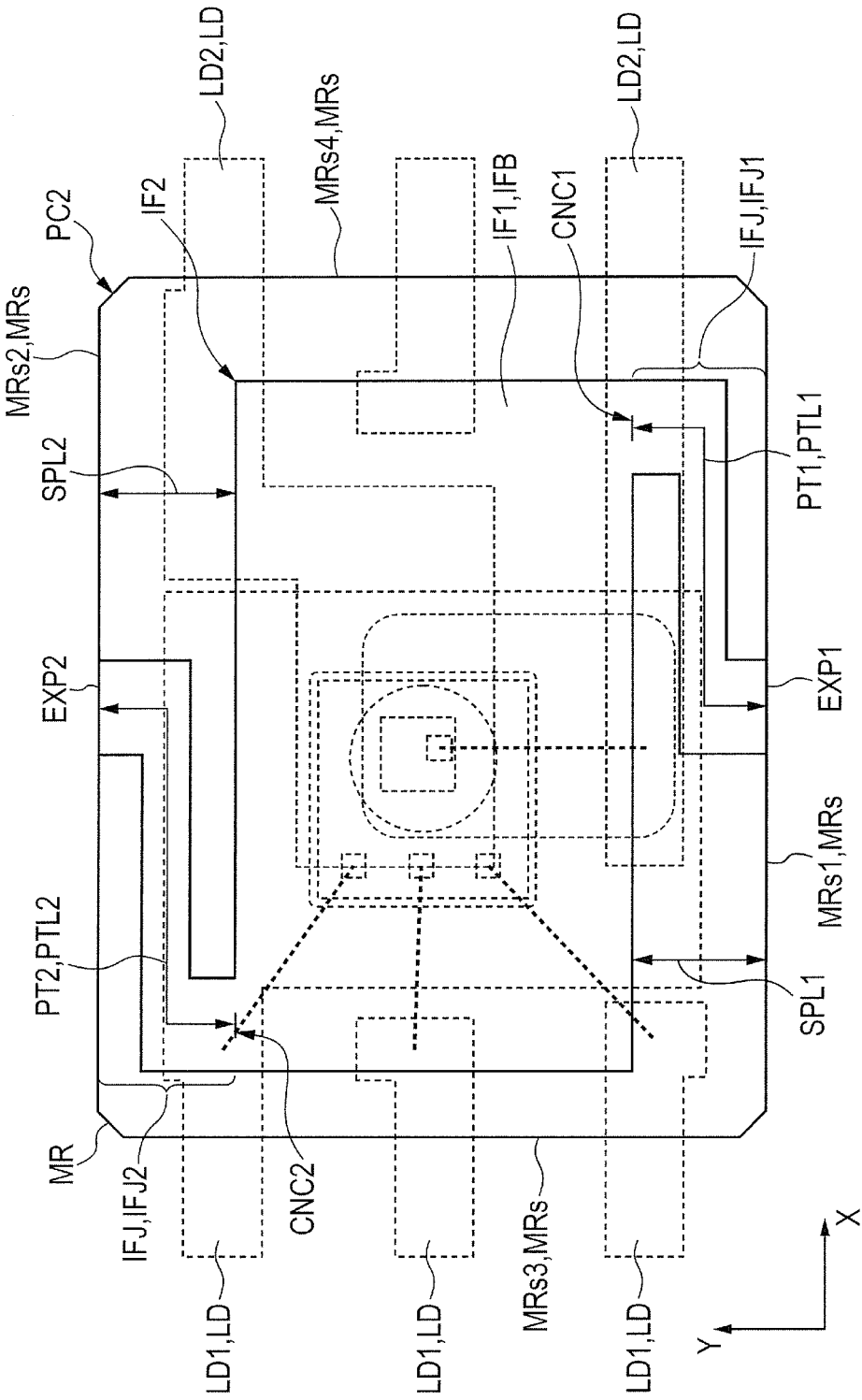
FIG. 22 is a plan view showing an internal structure of a photocoupler fabricated using the insulating film sheet shown in FIG. 21.

Also, in the foregoing embodiment, the joining parts IFJs of the insulating film sheet IFS linearly extend in the Y direction in which the array lines DVLs extend. However, as in the modification example shown in FIG. 21, the joining parts IFJs may each include bends relative to the direction in which the array lines DVLs extend (the Y direction in FIG. 21). FIG. 21 is an enlarged plan view of a portion of an insulating film sheet IFS2 representing a modification to the insulating film sheet IFS shown in FIG. 13. FIG. 22 is a plan view showing an internal structure of a photocoupler fabricated using the insulating film sheet IFS2 shown in FIG. 21.

In the insulating film sheet IFS2 shown in FIG. 21, each joining part IFJ joining two adjacent body parts IFBs includes bends, inside device forming parts DV3s, relative to the Y direction in which the array line DVL including the device forming parts DV3s extend. Namely, the extending length L1 of each joining part IFJ joining two adjacent body parts IFBs of the insulating film sheet IFS2 is larger than the distance L2 between the two adjacent body parts IFBs. This is the difference by which the insulating film sheet IFS2 shown in FIG. 21 differs from the insulating film sheet IFS shown in FIG. 13.

In the example shown in FIG. 21, each joining part IFJ joining two adjacent device forming parts DV3s includes two bends inside each of the two adjacent device forming parts DV3s.

FIG. 21 shows a photocoupler PC2 obtained by using the insulating film sheet IFS2 in which, as shown in FIG. 21, each joining part IFJ includes bends, formed inside each of the two adjacent device forming parts DV3s, relative to the Y direction in which the array line DVL including the device forming parts DV3s extend.

Namely, an insulating film IF2 included in the photocoupler PC2 shown in FIG. 22 has a joining part IFJ1 exposed at the side surface MRs1 and a joining part IFJ2 exposed at the side surface MRs2. The joining part IFJ1 includes an exposed end face EXP1 exposed from the sealed body MR, a coupling end part CNC1 coupled, at the end of the joining part IFJ1 opposite to the exposed end face EXP1, to the body part IFB, and an extending part PT1 extending between the exposed end face EXP1 and the coupling end part CNC1. The joining part IFJ2 includes an exposed end face EXP2 exposed from the sealed body MR, a coupling end part CNC2 coupled, at the end thereof opposite to the exposed end face EXP2, to the body part IFB, and an extending part PT2 extending between the exposed end face EXP2 and the coupling end part CNC2.

As shown in FIG. 22, the extending part PT1 of the joining part IFJ1 extends in the Y direction but through bends. In the example shown in FIG. 22, the extending part PT1 includes two bends between the side surface MRs1 of the sealed body MR and the body part IFB of the insulating film IF2. Therefore, the extending length PTL1 of the extending part PT1 is longer than the distance SPL1 between the side surface MRs1 of the sealed body MR and the body part IFB of the insulating film IF2.

Also, as shown in FIG. 22, the extending part PT2 of the joining part IFJ2 extends in the Y direction but through bends. In the example shown in FIG. 22, the extending part PT2 includes two bends between the side surface MRs2 of the sealed body MR and the body part IFB of the insulating film IF2. Therefore, the extending length PTL2 of the extending part PT2 is longer than the distance SPL2 between the side surface MRs2 of the sealed body MR and the body part IFB of the insulating film IF2.

The internal structure of the photocoupler PC2 shown in FIG. 22 can also be represented as follows. Namely, in the photocoupler PC2, the resin forming the sealed body MR is inserted between the exposed end face EXP1 of the joining part IFJ1 included in the insulating film IF2 and the body part IFB. Also, in the photocoupler PC2, the resin forming the sealed body MR is inserted between the exposed end face EXP2 of the joining part IFJ2 included in the insulating film IF2 and the body part IFB.

Each body part IFB of the insulating film IF2, like that of the insulating film IF1 used in the foregoing embodiment, is, as shown in FIG. 3, a member inserted between a light receiving element PA and a light emitting element PP. Therefore, to enable optical signal transmission between the light receiving element PA and the light emitting element PP, the insulating film IF2 is required to be made of a light-transmissive material.

When noise to the optical signal transmission path is taken into consideration, it is preferable not to allow the light receiving element PA (see FIG. 3) to be irradiated with any light, for example, outside light, other than the light emitted from the light emitting diode PP (see FIG. 3) used as a light source.

In the case of the photocoupler PC1 (see FIG. 5) of the foregoing embodiment or the photocoupler PC2 of the present modification example in which portions of the insulating films IF1 and IF2 are exposed from the sealed body MR, outside light may enter the photocoupler through the exposed end faces of the films. When, as in the present modification example, the joining parts IFJ1 and IFJ2 are formed to extend in the Y direction through bends, the route for outside light to enter the photocoupler is lengthened. This can inhibit outside light from reaching the light receiving element PA (see FIG. 3). Namely, the photocoupler PC2 can be made more resistant to optical noise than the photocoupler PC1.

As shown in FIG. 5 and FIG. 22, in the foregoing embodiment and in the present modification example, the body parts of the insulating films IF1 and IF2 are not exposed from the sealed body MR whereas the joining parts IFJs smaller in width (length in a direction perpendicular to the direction in which they extend) than the body parts IFBs are exposed. This, compared with cases in which the body parts (IFBs) that are relatively large in width are exposed from the sealed body MR, can inhibit outside light from reaching the light receiving element PA (see FIG. 3).

In the present modification example, each joining part IFJ includes, as shown in FIG. 21, two bends in each of the two adjacent device forming parts DV3s joined by it so as to lengthen the route for light coming in from outside. However, the route for light coming in from outside can also be lengthened in various alternative manners. For example, all or some of the bends shown in FIG. 21 may be curved. Or, each joining part IFJ shown in FIG. 21 may include three or more bends, whether curved or not, in each of the two adjacent device forming parts DV3s joined by it, possibly causing each joining part IFJ to have a zigzag shape or a meandering shape in a plan view.

However, when the space required for each joining part IFJ becomes larger, the area of each body part IFB becomes relatively smaller. From the viewpoint of improving the insulating characteristic for insulation between the output part POP and the input part PIP shown in FIG. 3, each body part IFB preferably has a largest possible area. From this viewpoint, like the joining part IFJ1 or IFJ2 shown in FIG. 22, each joining part IFJ is preferably formed to include two bends, whether curved or not.

Modification Example 4

Figure 23:
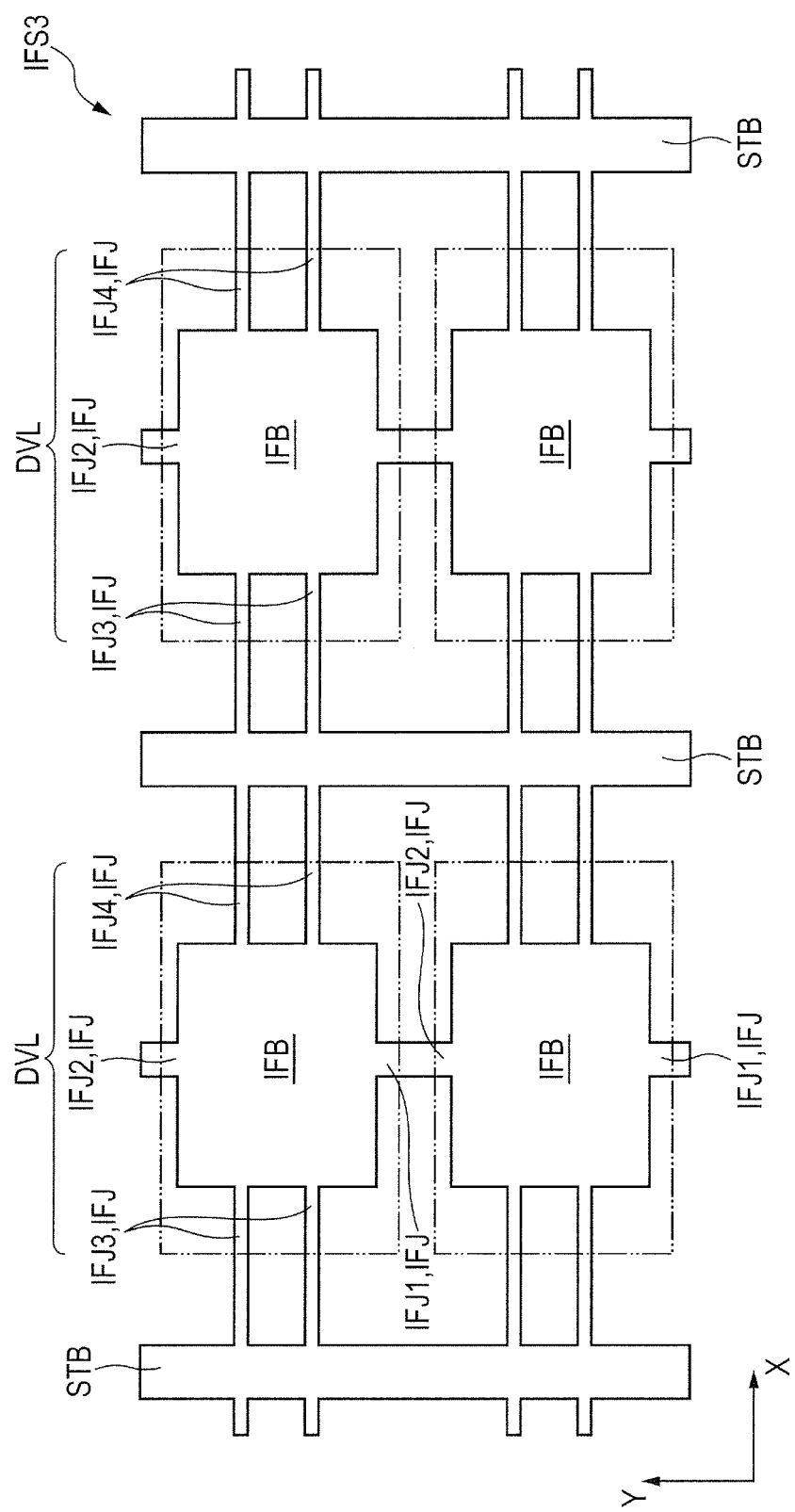
FIG. 23 is an enlarged plan view of a portion of an insulting film sheet representing another example of modification to the insulating film sheet shown in FIG. 13.
Figure 24:
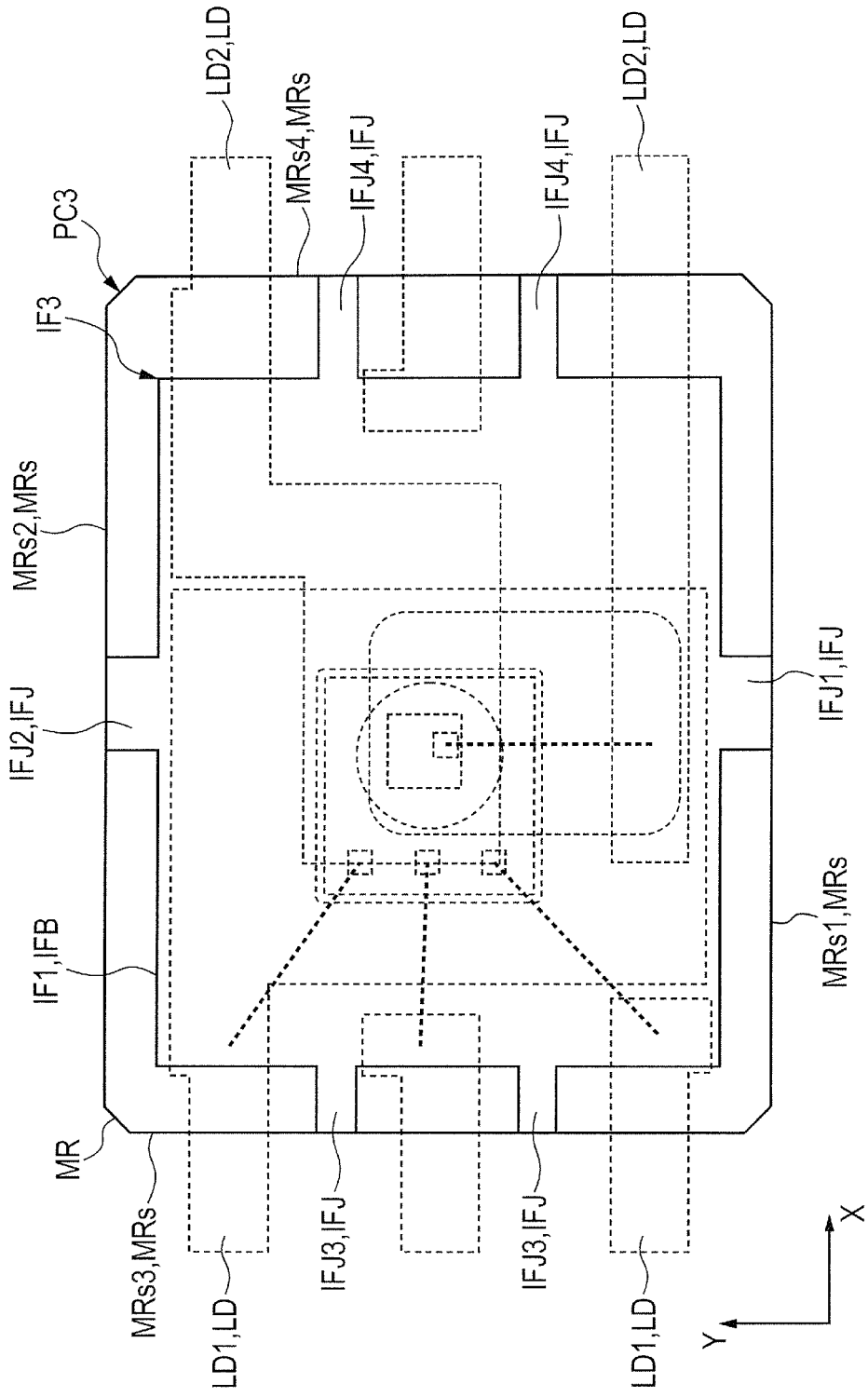
FIG. 24 is a plan view showing an internal structure of a photocoupler fabricated using the insulating film sheet shown in FIG. 23.

In the foregoing embodiment, as members to support each body part IFB of the insulating film IF1 during the fabrication process, two joining parts IFJs are formed to extend in a direction (the Y direction in the example shown in FIG. 5) different from the direction (the X direction in the example shown in FIG. 5) in which the leads LDs extend. In this regard, it has been described that having the joining parts IFJs extend in a direction different from the direction in which the leads LDs extend increases the layout flexibility for the joining parts IFJs and the leads LDs. However, the foregoing embodiment may be modified such that more than two joining parts IFJs are formed to support each body part IFB. FIG. 23 is an enlarged plan view of a portion of an insulting film sheet IFS3 representing another example of modification to the insulating film sheet IFS shown in FIG. 13. FIG. 24 is a plan view showing an internal structure of a photocoupler fabricated using the insulating film sheet IFS3 shown in FIG. 23.

The insulating film sheet IFS3 shown in FIG. 23 differs from the insulating film sheet IFS shown in FIG. 13 as follows. Namely, of the joining parts IFJs joined to each of the body parts IFBs included in the insulating film sheet IFS3, some (joining parts IFJ1s and IFJ2s) extend in the Y direction in which the array lines DVL each including device forming parts DV3s extend, whereas the others (joining parts IJF3s and IFJ4s) extend in the X direction perpendicular to the Y direction. In other words, in the insulating film sheet IFS3, each body part IFB is joined with joining parts IFJs extending in the X and Y directions.

In the insulating film sheet IFS3 with each body part IFB joined with joining parts IFJs extending in both the X and Y directions, the body parts IFBs can be supported more stably than in the insulating film sheet IFS used in the foregoing embodiment or the insulating film sheet IFS2 used in the foregoing modification example 3. Therefore, in cases where the insulating film sheet IFS3 is easy to deform due to, for example, its thickness or material, the present modification example is particularly effective, as stably supporting each body part IFB can suppress warping of each array line DVL at around a middle portion thereof.

FIG. 24 shows a photocoupler PC3 obtained by using the insulating film sheet IFS3 in which, as shown in FIG. 23, each body part IFB is joined with the joining parts IFJ1 and IFJ2 extending in the X direction and the joining parts IFJ3 and IFJ4 extending in the Y direction.

Namely, of the joining parts of an insulating film IF3 included in the photocoupler PC3 shown in FIG. 24, the joining part IFJ1 is exposed at the side surface MRs1 of the sealed body MR and the joining part IFJ2 is exposed at the side surface MRs2 opposite to the side surface MRs1 of the sealed body MR. The joining parts IFJ3s are exposed at the side surface MRs3 of the sealed body MR that faces in the X direction perpendicular to the Y direction in which the side surfaces MRs1 and MRs2 both face. The joining parts IFJ4s are exposed at the side surface MRs4 opposite to the side surface MRs3 of the sealed body MR.

When, as in the present modification example, the plural joining parts IFJ3s and IFJ4s to extend in the X direction in which plural leads LDs extend are formed, it is necessary to lay out the leads LDs and the joining parts IFJ3s and IFJ4s not to allow interference between them in the vicinity of the side surfaces MRs's of the sealed body MR.

In the example shown in FIG. 24, the joining parts IFJ3s are exposed from the sealed body MR at locations between the leads LD1s. Also, the joining parts IFJ4s are exposed from the sealed body MR at locations between the leads LD2. To avoid interference between the leads LDs and the joining parts IFJ3s and IFJ4s, an alternative layout different from the example shown in FIG. 24 may be employed in which the joining parts IFJ3s are exposed from the sealed body MR at locations outside the range between the leads LD1s and in which the joining parts IFJ4s are exposed from the sealed body MR at locations outside the range between the leads LD2s. However, from the standpoint of keeping the leads LD1s and also the leads LD2s wide apart from each other, the joining parts IFJ3s and IFJ4s are preferably positioned between the leads LDs, respectively, as shown in FIG. 24.

Referring to FIG. 23, when the distance between adjacent array lines DVLs is lengthened, the following layout is preferable. Namely, support bars STBs extending in the Y direction are formed between adjacent array lines DVLs as shown in FIG. 23. Also, one end of each joining part IFJ3 and one end of each joining part IFJ4 are preferably joined to a body part IFB, whereas the other end of each joining part IFJ3 and the other end of each joining part IFJ4 are preferably joined to a support bar STB. Also, though not shown, both ends of each support bar STB are preferably joined to the frame part FL3 shown in FIG. 13. This further increases the supporting strength of the joining parts IFJ3s and IFJ4s.

Modification Example 5

In the foregoing embodiment, a photocoupling device is fabricated using an insulating film sheet IFS including plural device forming parts DV3s inside a frame part FL3 thereof as shown in FIG. 13. However, the effect of the insulating film sheet IFS to stably control the positions of body parts IFBs via joining parts IFJs, both included in the insulating film sheet IFS, can be obtained also in cases where only one device forming part DV3 is formed inside the frame part FL3.

Modification Example 6

Furthermore, the foregoing modification examples may be applied in combination without departing from the scope of the technological concept described above of the foregoing embodiment.

The following represents part of the description of the foregoing embodiment of the present invention.

The photocoupling device manufacturing method includes the steps of (a) preparing a first lead frame, (b) preparing a second lead frame, and (c), after the steps (a) and (b), superposing the first lead frame and the second lead frame. The first lead frame prepared in the step (a) includes: plural first device forming parts arranged like a matrix, each of the first device forming parts having (i) a first chip mounting part mounted with a first semiconductor chip which has a first main surface where a first optical element is formed and (ii) plural first leads electrically coupled to the first semiconductor chip; and a first frame part surrounding the first device forming parts and supporting the first chip mounting parts and the first leads.

The second lead frame prepared in the step (b) includes: plural second device forming parts arranged like a matrix, each of the second device forming parts having (i) a second chip mounting part mounted with a second semiconductor chip which has a second main surface where a second optical element is formed and (ii) plural second leads electrically coupled to the second semiconductor chip; and a second frame part surrounding the second device forming parts and supporting the second chip mounting parts and the second leads. The first lead frame and the second lead frame are superposed in the step (c) after the steps (a) and (b) such that the first optical elements and the second optical elements respectively oppose each other via a first light-transmissive resin covering the first optical elements, a second light-transmissive resin covering the second optical elements, and a light-transmissive insulating film sheet positioned between the first light-transmissive resin and the second light-transmissive resin. The insulating film sheet includes plural body parts positioned, in the step (c), between the first optical elements and the second optical elements, respectively, plural joining parts joined to the body parts, and a third frame part fixed, in the step (c), to surround the body parts between the first frame part and the second frame part.

What is claimed is:

1. A photocoupling device, comprising:
   a first semiconductor chip including a first main surface where a first optical element is formed;
   a first chip mounting part mounted with the first semiconductor chip;
   a plurality of first leads electrically coupled to the first semiconductor chip;
   a first light-transmissive resin covering the first optical element;
   a second semiconductor chip including a second main surface where a second optical element opposing the first optical element is formed;
   a second chip mounting part mounted with the second semiconductor chip;
   a plurality of second leads electrically coupled to the second semiconductor chip;
   a second light-transmissive resin covering the second optical element;
   a light-transmissive insulating film positioned between the first light-transmissive resin and the second light-transmissive resin; and
   a sealed part sealing with resin the first semiconductor chip, the first chip mounting part, a part of each of the first leads, the first light-transmissive resin, the second semiconductor chip, the second chip mounting part, a part of each of the second leads, the second light-transmissive resin, and the insulating film,
   wherein the insulating film includes a body part positioned between the first optical element and the second optical element and a plurality of joining parts joined to the body part,
   wherein the sealed part includes a first surface positioned on a first chip mounting part side, a second surface positioned opposite to the first surface, a first side surface positioned between the first surface and the second surface, and a second side surface positioned opposite to the first side surface,
   wherein, out of the joining parts, a first joining part is exposed at the first side surface of the sealed part, and
   wherein, out of the joining parts, a second joining part is exposed at the second side surface of the sealed part.

2. The photocoupling device according to claim 1,
   wherein the sealed part further includes a third side surface positioned between the first surface and the second surface and between the first side surface and the second side surface and a fourth side surface opposite to the third side surface,
   wherein the first leads are exposed at the third side surface of the sealed part, and
   wherein the second leads are exposed at the fourth side surface of the sealed part.

3. The photocoupling device according to claim 1,
   wherein the first joining part includes a first exposed end part exposed from the sealed part, a first coupling end part opposite to the first exposed end part, the first coupling end part being coupled to the body part included in the insulating film, and a first extending part extending between the first exposed end part and the first coupling end part,
   wherein the second joining part includes a second exposed end part exposed from the sealed part, a second coupling end part opposite to the second exposed end part, the second coupling end part being coupled to the body part included in the insulating film, and a second extending part extending between the second exposed end part and the second coupling end part,
   wherein an extending length of the first extending part is larger than a distance between the first side surface and the body part included in the insulating film, and
   wherein an extending length of the second extending part is larger than a distance between the second side surface and the body part included in the insulating film.

4. The photocoupling device according to claim 1,
   wherein the sealed part includes a third side surface positioned between the first surface and the second surface and between the first side surface and the second side surface and a fourth side surface opposite to the third side surface,
   wherein, out of the joining parts, a third joining part is exposed at the third side surface of the sealed part, and
   wherein, out of the joining parts, a fourth joining part is exposed at the fourth side surface of the sealed part.

5. The photocoupling device according to claim 4,
wherein the first leads are exposed at the third side surface of the sealed part and the third joining part is exposed, between the first leads, from the sealed part, and
wherein the second leads are exposed at the fourth side surface of the sealed part and the fourth joining part is exposed, between the second leads, from the sealed part.

6. The photocoupling device according to claim 1,
wherein a portion of the first leads is electrically coupled to the first semiconductor chip via a first wire; and
wherein a portion of the second leads is electrically coupled to the second semiconductor chip via a second wire.

7. A power conversion system comprising an amplifier circuit part and a photocoupling part coupled to the amplifier circuit part,
wherein the photocoupling part includes:
  a first semiconductor chip having a first main surface where a first optical element is formed;
  a first chip mounting part mounted with the first semiconductor chip;
  a plurality of first leads electrically coupled to the first semiconductor chip;
  a first light-transmissive resin covering the first optical element;
  a second semiconductor chip having a second main surface where a second optical element opposing the first optical element is formed;
  a second chip mounting part mounted with the second semiconductor chip;
  a plurality of second leads electrically coupled to the second semiconductor chip;
  a second light-transmissive resin covering the second optical element;
  a light-transmissive insulating film positioned between the first light-transmissive resin and the second light-transmissive resin; and
  a sealed part sealing with resin the first semiconductor chip, the first chip mounting part, a part of each of the first leads, the first light-transmissive resin, the second semiconductor chip, the second chip mounting part, a part of each of the second leads, the second light-transmissive resin, and the insulating film,
wherein the insulating film includes a body part positioned between the first optical element and the second optical element and a plurality of joining parts joined to the body part,
wherein the sealed part includes a first surface positioned on a first chip mounting part side, a second surface positioned opposite to the first surface, a first side surface positioned between the first surface and the second surface, and a second side surface positioned opposite to the first side surface,
wherein, out of the joining parts, a first joining part is exposed at the first side surface of the sealed part, and
wherein, out of the joining parts, a second joining part is exposed at the second side surface of the sealed part.

* * * * *